United States Patent
Feng et al.

(10) Patent No.: US 11,328,672 B2
(45) Date of Patent: May 10, 2022

(54) SHIFT REGISTER UNIT AND DRIVING METHOD THEREOF, GATE DRIVING CIRCUIT, AND DISPLAY DEVICE

(71) Applicants: HEFEI BOE JOINT TECHNOLOGY CO., LTD., Hefei (CN); BOE TECHNOLOGY GROUP CO., LTD., Beijing (CN)

(72) Inventors: Xuehuan Feng, Beijing (CN); Yongqian Li, Beijing (CN)

(73) Assignees: HEFEI BOE JOINT TECHNOLOGY CO., LTD., Anhui (CN); BOE TECHNOLOGY GROUP CO., LTD., Beijing (CN)

(*) Notice: Subject to any disclaimer, the term of this patent is extended or adjusted under 35 U.S.C. 154(b) by 57 days.

(21) Appl. No.: 16/765,565

(22) PCT Filed: Jan. 8, 2020

(86) PCT No.: PCT/CN2020/070866
§ 371 (c)(1),
(2) Date: May 20, 2020

(87) PCT Pub. No.: WO2020/173229
PCT Pub. Date: Sep. 3, 2020

(65) Prior Publication Data
US 2021/0201806 A1  Jul. 1, 2021

(30) Foreign Application Priority Data
Feb. 25, 2019 (CN) .......................... 201910138433.6

(51) Int. Cl.
*G09G 5/00* (2006.01)
*G09G 3/3266* (2016.01)
(Continued)

(52) U.S. Cl.
CPC ......... *G09G 3/3266* (2013.01); *G09G 3/3225* (2013.01); *G11C 19/28* (2013.01);
(Continued)

(58) Field of Classification Search
CPC .. G09G 3/3208; G09G 3/3225; G09G 3/3266; G09G 3/3677; G09G 2300/0426;
(Continued)

(56) References Cited

U.S. PATENT DOCUMENTS

2011/0157124 A1* 6/2011 Jung .................. G11C 19/28
345/211
2016/0232852 A1  8/2016 An et al.
(Continued)

FOREIGN PATENT DOCUMENTS

CN   107507556 A  * 12/2017 ............... G09G 3/20
CN   108648716 A    10/2018
(Continued)

*Primary Examiner* — Adam J Snyder
(74) *Attorney, Agent, or Firm* — Dilworth & Barrese, LLP.; Michael J. Musella, Esq.

(57) ABSTRACT

A shift register unit and a driving method thereof, a gate driving circuit, and a display device are provided. The shift register unit includes: a first input circuit, a second input circuit, an output circuit, and a compensation circuit, the first input circuit is configured to write a first input signal to the first node in response to a first control signal; the second input circuit is configured to input a second input signal to the second node in response to a detection control signal and configured to transmit a level of the second node to the first node in response to a second control signal; the compensation circuit is configured to compensate the level of the second node; and the output circuit is configured to output a composite output signal to the output terminal under control of a level of the first node.

19 Claims, 11 Drawing Sheets

(51) Int. Cl.
    *G09G 3/3225* (2016.01)
    *G11C 19/28* (2006.01)
    *G09G 3/36* (2006.01)
    *G09G 3/3208* (2016.01)

(52) U.S. Cl.
    CPC ......... *G09G 3/3208* (2013.01); *G09G 3/3677* (2013.01); *G09G 2300/0426* (2013.01); *G09G 2310/0286* (2013.01); *G09G 2310/061* (2013.01); *G09G 2310/08* (2013.01); *G09G 2320/0233* (2013.01)

(58) Field of Classification Search
    CPC ..... G09G 2310/0286; G09G 2310/061; G09G 2310/08; G09G 2320/0233; G11C 19/28
    See application file for complete search history.

(56) References Cited

U.S. PATENT DOCUMENTS

| | | | |
|---|---|---|---|
| 2016/0335962 A1* | 11/2016 | Xiao | G09G 3/3677 |
| 2017/0186378 A1* | 6/2017 | Na | G09G 3/3266 |
| 2018/0337682 A1* | 11/2018 | Takasugi | G09G 3/3266 |
| 2019/0103166 A1* | 4/2019 | Yuan | G09G 3/3266 |
| 2020/0135286 A1 | 4/2020 | Li et al. | |

FOREIGN PATENT DOCUMENTS

| | | |
|---|---|---|
| CN | 108735142 A | 11/2018 |
| CN | 109192171 A | 1/2019 |
| CN | 109658865 A | 4/2019 |

* cited by examiner

SHIFT REGISTER UNIT AND DRIVING METHOD THEREOF, GATE DRIVING CIRCUIT, AND DISPLAY DEVICE

CROSS-REFERENCE TO RELATED APPLICATION

The present application claims priority of Chinese Patent Application No. 201910138433.6, filed on Feb. 25, 2019, and for all purposes, the entire content disclosed by the Chinese patent application is incorporated herein by reference as part of the present application.

TECHNICAL FIELD

Embodiments of the present disclosure relate to a shift register unit and a driving method thereof, a gate driving circuit, and a display device.

BACKGROUND

In a field of display technology, a display panel, such as a liquid crystal display (LCD) or an organic light-emitting diode (OLED) display panel, includes a plurality of gate lines and a plurality of data lines. The plurality of gate lines can be driven by a gate driving circuit. The gate driving circuit is usually integrated in a Gate IC (integrated circuit). With the rapid development of the display technology, display panels are increasingly developing towards high integration and low cost. In the design of the Gate IC, an area of a chip is a main factor affecting a cost of the chip. How to effectively reduce the chip area is a problem that technical developers need to consider emphatically.

SUMMARY

Some embodiments of the present disclosure provides a shift register unit, which includes a first input circuit, a second input circuit, an output circuit, and a compensation circuit, the first input circuit is connected to a first node, and is configured to write a first input signal to the first node in response to a first control signal; the second input circuit is connected to the first node and a second node, and is configured to input a second input signal to the second node in response to a detection control signal and configured to transmit a level of the second node to the first node in response to a second control signal; the compensation circuit is connected to the second node, and is configured to compensate the level of the second node; and the output circuit is connected to the first node and an output terminal, and is configured to output a composite output signal to the output terminal under control of a level of the first node.

For example, in the shift register unit provided by some embodiments of the present disclosure, the compensation circuit comprises a first compensation sub-circuit, a second compensation sub-circuit, and a storage sub-circuit, the first compensation sub-circuit is connected to the second node and a third node, respectively, and is configured to write a first clock signal to the third node under control of the level of the second node; the storage sub-circuit is connected to the second node and the third node, respectively, and is configured to compensate the level of the second node based on the first clock signal written to the third node; and the second compensation sub-circuit is connected to the third node, and is configured to perform noise reduction on the third node under control of a compensation noise reduction signal.

For example, in the shift register unit provided by some embodiments of the present disclosure, the second compensation sub-circuit is further connected to a fourth node to receive a voltage of the fourth node as the compensation noise reduction signal.

For example, in the shift register unit provided by some embodiments of the present disclosure, the first compensation sub-circuit comprises a first compensation transistor, the second compensation sub-circuit comprises a second compensation transistor, the storage sub-circuit comprises a first capacitor, a first electrode of the first compensation transistor is connected to a first clock signal terminal to receive the first clock signal, a second electrode of the first compensation transistor is connected to the third node, a gate electrode of the first compensation transistor is connected to the second node, a first terminal of the first capacitor is connected to the second node, a second terminal of the first capacitor is connected to the third node, a first electrode of the second compensation transistor is connected to the third node, a second electrode of the second compensation transistor is connected to a first voltage terminal, and a gate electrode of the second compensation transistor is connected to the fourth node.

For example, in the shift register unit provided by some embodiments of the present disclosure, the first clock signal is identical to the second control signal.

For example, in the shift register unit provided by some embodiments of the present disclosure, the second input circuit comprises a charging sub-circuit and an isolation sub-circuit, the charging sub-circuit is configured to input the second input signal to the second node in response to the detection control signal; and the isolation sub-circuit is connected to the first node and the second node, respectively, and is configured to transmit the level of the second node to the first node under control of the second control signal.

For example, in the shift register unit provided by some embodiments of the present disclosure, the charging sub-circuit comprises a first transistor, a gate electrode of the first transistor is configured to receive the detection control signal, a first electrode of the first transistor is configured to receive the second input signal, and a second electrode of the first transistor is connected to the second node; and the isolation sub-circuit comprises a second transistor, a gate electrode of the second transistor is configured to receive the second control signal, a first electrode of the second transistor is connected to the second node, and a second electrode of the second transistor is connected to the first node.

For example, in the shift register unit provided by some embodiments of the present disclosure, the first input circuit comprises a third transistor, a gate electrode of the third transistor is connected to a first control signal terminal to receive the first control signal, a first electrode of the third transistor is configured to receive the first input signal, and a second electrode of the third transistor is connected to the first node.

For example, in the shift register unit provided by some embodiments of the present disclosure, the output terminal comprises a shift signal output terminal and a first scanning signal output terminal, the output circuit comprises a first output transistor, a second output transistor, and a second capacitor; a gate electrode of the first output transistor is connected to the first node, a first electrode of the first output transistor is connected to a first output clock signal terminal to receive a first output clock signal, and a second electrode of the first output transistor is connected to the shift signal output terminal; a gate electrode of the second output transistor is connected to the first node, a first electrode of the second output transistor is connected to the first output clock signal terminal to receive the first output clock signal, and a second electrode of the second output transistor is connected to the first scanning signal output terminal; a first terminal of the second capacitor is connected to the first node, and a second terminal of the second capacitor is connected to the second electrode of the second output transistor; and the first output clock signal is transmitted to the shift signal output terminal via the first output transistor and serves as a first output signal, the first output clock signal is transmitted to the first scanning signal output terminal via the second output transistor and serves as a second output signal, and the composite output signal comprises the first output signal and the second output signal.

For example, in the shift register unit provided by some embodiments of the present disclosure, the output terminal further comprises a second scanning signal output terminal, and the output circuit further comprises a third output transistor and a third capacitor, a gate electrode of the third output transistor is connected to the first node, a first electrode of the third output transistor is connected to a second output clock signal terminal to receive a second output clock signal, a second electrode of the third output transistor is connected to the second scanning signal output terminal, a first terminal of the third capacitor is connected to the first node, a second terminal of the third capacitor is connected to the second electrode of the third output transistor, and the second output clock signal is transmitted to the second scanning signal output terminal via the third output transistor and serves as a third output signal, and the composite output signal further comprises the third output signal.

For example, the shift register unit provided by some embodiments of the present disclosure further comprises a noise reduction circuit and a first control circuit; the noise reduction circuit is connected to the first node, a fourth node, and the output terminal, and is configured to simultaneously perform noise reduction on the first node and the output terminal under control of a level of the fourth node; and the first control circuit is connected to the first node and the fourth node, and is configured to control the level of the fourth node under control of the level of the first node.

For example, the shift register unit provided by some embodiments of the present disclosure further comprises a second control circuit; the second control circuit is connected to a fourth node, and is configured to control a level of the fourth node in response to a third control signal, and the third control signal comprises a first clock signal and a voltage of the second node.

For example, the shift register unit provided by some embodiments of the present disclosure further comprises a third control circuit; the third control circuit is connected to a fourth node, and is configured to control a level of the fourth node in response to a fourth control signal.

For example, the shift register unit provided by some embodiments of the present disclosure further comprises a first reset circuit and a second reset circuit; the first reset circuit is connected to the first node, and is configured to reset the first node in response to a first reset control signal; and the second reset circuit is connected to the first node, and is configured to reset the first node in response to a second reset control signal.

For example, the shift register unit provided by some embodiments of the present disclosure further comprises a noise reduction circuit, a first control circuit, a second control circuit, a third control circuit, a first reset circuit, and a second reset circuit; the compensation circuit comprises a first compensation transistor, a second compensation transistor, and a first capacitor, a first electrode of the first compensation transistor is connected to a first clock signal terminal to receive a first clock signal, a second electrode of the first compensation transistor is connected to a third node, a gate electrode of the first compensation transistor is connected to the second node, a first terminal of the first capacitor is connected to the second node, a second terminal of the first capacitor is connected to the third node, a first electrode of the second compensation transistor is connected to the third node, a second electrode of the second compensation transistor is connected to a first voltage terminal, and a gate electrode of the second compensation transistor is connected to a fourth node to receive a voltage of the fourth node as a compensation noise reduction signal; the second input circuit comprises a charging sub-circuit and an isolation sub-circuit, the charging sub-circuit comprises a first transistor, a gate electrode of the first transistor is configured to receive the detection control signal, a first electrode of the first transistor is configured to receive the second input signal, a second electrode of the first transistor is connected to the second node, the isolation sub-circuit comprises a second transistor, a gate electrode of the second transistor is configured to receive the second control signal, a first electrode of the second transistor is connected to the second node, and a second electrode of the second transistor is connected to the first node; the first input circuit comprises a third transistor, a gate electrode of the third transistor is configured to receive the first control signal, a first electrode of the third transistor is configured to receive the first input signal, and a second electrode of the third transistor is connected to the first node; the output circuit comprises a first output transistor, a second output transistor, a third output transistor, a second capacitor, and a third capacitor, and the output terminal comprises a shift signal output terminal, a first scanning signal output terminal, and a second scanning signal output terminal, a gate electrode of the first output transistor is connected to the first node, a first electrode of the first output transistor is connected to a first output clock signal terminal to receive a first output clock signal, a second electrode of the first output transistor is connected to the shift signal output terminal, a gate electrode of the second output transistor is connected to the first node, a first electrode of the second output transistor is connected to the first output clock signal terminal to receive the first output clock signal, a second electrode of the second output transistor is connected to the first scanning signal output terminal, a first terminal of the second capacitor is connected to the first node, a second terminal of the second capacitor is connected to the second electrode of the first output transistor, a gate electrode of the third output transistor is connected to the first node, a first electrode of the third output transistor is connected to a second output clock signal terminal to receive a second output clock signal, a second electrode of the third output transistor is connected to the second scanning signal output terminal, a first terminal of the third capacitor is connected to the first node, a second terminal of the third capacitor is connected to the second electrode of the third output transistor, the first output clock signal is transmitted to the shift signal output terminal via the first output transistor and serves as a first output signal, the first output clock signal is transmitted to the first scanning signal output terminal via the second output transistor and serves as a second output signal, the second output clock signal is transmitted to the second scanning signal output terminal via the third output transistor and serves as a third output signal, and the composite output signal comprises the first output signal, the second output signal, and the third output signal; the noise reduction circuit comprises a fourth transistor, a fifth transistor, a sixth transistor, and a seventh transistor, a gate electrode of the fourth transistor is connected to the fourth node, a first electrode of the fourth transistor is connected to the first node, a second electrode of the fourth transistor is connected to the first voltage terminal, a gate electrode of the fifth transistor is connected to the fourth node, a first electrode of the fifth transistor is connected to the shift signal output terminal, a second electrode of the fifth transistor is connected to the first voltage terminal, a gate electrode of the sixth transistor is connected to the fourth node, a first electrode of the sixth transistor is connected to the first scanning signal output terminal, a second electrode of the sixth transistor is connected to the second voltage terminal, a gate electrode of the seventh transistor is connected to the fourth node, a first electrode of the seventh transistor is connected to the second scanning signal output terminal, and a second electrode of the seventh transistor is connected to a second voltage terminal; the first control circuit comprises an eighth transistor and a ninth transistor, a gate electrode of the eighth transistor is connected to a first electrode of the eighth transistor, and is configured to be connected to a third voltage terminal, a second electrode of the eighth transistor is connected to the fourth node, a gate electrode of the ninth transistor is connected to the first node, a first electrode of the ninth transistor is connected to the fourth node, and a second electrode of the ninth transistor is connected to the first voltage terminal; the first reset circuit comprises a tenth transistor, a gate electrode of the tenth transistor is connected to a first reset control signal terminal to receive a first reset control signal, a first electrode of the tenth transistor is connected to the first node, and a second electrode of the tenth transistor is connected to the first voltage terminal; the second reset circuit comprises an eleventh transistor, a gate electrode of the eleventh transistor is connected to a second reset control signal terminal to receive a second reset control signal, a first electrode of the eleventh transistor is connected to the first node, and a second electrode of the eleventh transistor is connected to the first voltage terminal; the second control circuit comprises a twelfth transistor and a thirteenth transistor, a gate electrode of the twelfth transistor is configured to receive the first clock signal, a first electrode of the twelfth transistor is configured to be connected to the fourth node, a second electrode of the twelfth transistor is connected to a first electrode of the thirteenth transistor, a gate electrode of the thirteenth transistor is connected to the second node, and a second electrode of the thirteenth transistor is connected to the first voltage terminal; and the third control circuit comprises a fourteenth transistor, a gate electrode of the fourteenth transistor is configured to receive a fourth control signal, a first electrode of the fourteenth transistor is connected to the fourth node, and a second electrode of the fourteenth transistor is connected to the first voltage terminal.

Some embodiments of the present disclosure also provide a gate driving circuit, which comprises a plurality of shift register units; the plurality of shift register units are cascaded, and each shift register unit in the plurality of shift register units is the shift register unit according to any one of embodiments of the present disclosure.

For example, the gate driving circuit provided by some embodiments of the present disclosure further includes a first clock signal line, a second clock signal line, a third clock signal line, and a fourth clock signal line; in a case where the shift register unit comprises a first output clock signal terminal, a first output clock signal terminal of a $(4n_1-3)$-th stage shift register unit in the plurality of shift register units is connected to the first clock signal line; a first output clock signal terminal of a $(4n_1-2)$-th stage shift register unit in the plurality of shift register units is connected to the second clock signal line; a first output clock signal terminal of a $(4n_1-1)$-th stage shift register unit in the plurality of shift register units is connected to the third clock signal line; a first output clock signal terminal of a $(4n_1)$-th stage shift register unit in the plurality of shift register units is connected to the fourth clock signal line; and $n_1$ is an integer greater than zero.

For example, the gate driving circuit provided by some embodiments of the present disclosure further includes a fifth clock signal line, a sixth clock signal line, a seventh clock signal line, and an eighth clock signal line; in a case where the shift register unit comprises a second output clock signal terminal, a second output clock signal terminal of the $(4n_1-3)$-th stage shift register unit is connected to the fifth clock signal line; a second output clock signal terminal of the $(4n_1-2)$-th stage shift register unit is connected to the sixth clock signal line; a second output clock signal terminal of the $(4n_1-1)$-th stage shift register unit is connected to the seventh clock signal line; and a second output clock signal terminal of the $(4n_1)$-th stage shift register unit is connected to the eighth clock signal line.

For example, in the gate driving circuit provided by some embodiments of the present disclosure, in a case where the shift register unit comprises a shift signal output terminal and a first control signal terminal, a first control signal terminal of an $(n_2+3)$-th stage shift register unit in the plurality of shift register units is connected to a shift signal output terminal of an $(n_2)$-th stage shift register unit in the plurality of shift register units, and $n_2$ is an integer greater than zero.

For example, in the gate driving circuit provided by some embodiments of the present disclosure, a signal output from the shift signal output terminal of the $(n_2)$-th stage shift register unit serves as a second input signal of an $(n_2+2)$-th stage shift register unit.

For example, in the gate driving circuit provided by some embodiments of the present disclosure, in a case where the shift register unit further comprises a first reset control signal terminal, a first reset control signal terminal of the $(n_2)$-th stage shift register unit is connected to a shift signal output terminal of the $(n_2+3)$-th stage shift register unit.

Some embodiments of the present disclosure also provide a display device including the gate driving circuit described in any one of the above embodiments.

Some embodiments of the present disclosure also provide a driving method for driving the shift register unit as describe in any one of the above embodiments, one frame comprises a display period and a blanking period, the display period comprises a first input phase and a first output phase, the blanking period comprises a second input phase and a second output phase, and the driving method comprises: in the first input phase, in response to the first control signal, the first input circuit writing the first input signal to the first node; in the first output phase, under control of the level of the first node, the output circuit outputting the composite output signal to the output terminal; in the second input phase, the compensation circuit compensating the level of the second node, and in respond to the second control signal, the second input circuit transmitting the level of the second node to the first node; and in the second output phase, the output circuit outputting the composite output signal to the output terminal under control of the level of the first node.

BRIEF DESCRIPTION OF THE DRAWINGS

In order to clearly illustrate the technical solutions of the embodiments of the present disclosure, the drawings of the embodiments will be briefly described in the following; it is obvious that the described drawings are only related to some embodiments of the present disclosure and thus are not limitative to the present disclosure.

DETAILED DESCRIPTION

Figure 1:
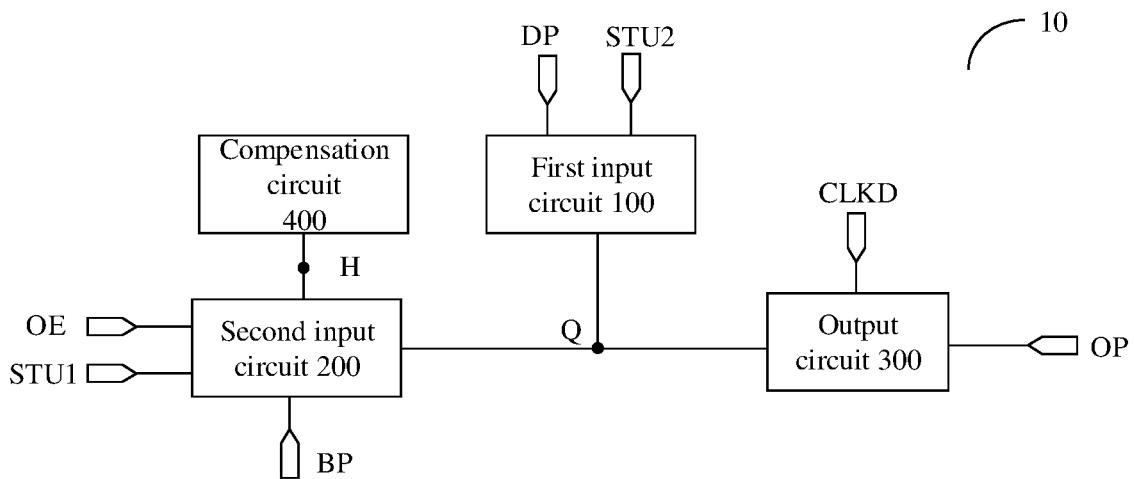
FIG. 1 is a schematic block diagram of a shift register unit provided by some embodiments of the present disclosure.

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In order to keep the following description of embodiments of the present disclosure clear and concise, detailed descriptions of some known functions and known components are omitted from the present disclosure.

In an OLED display panel, in order to compensate for display unevenness caused by threshold drift of a driving transistor in a pixel circuit, a voltage drop of a power line, aging of an organic light-emitting diode, and the like, an external compensation method may be adopted. In the external compensation method, the pixel circuit includes a data writing transistor, the driving transistor, a storage capacitor, a sensing transistor, and a sensing line, and a threshold voltage of the driving transistor or a power supply voltage drop in the pixel circuit and the like are sensed through the sensing transistor and the sensing line, and are compensated based on sensing data on the sensing line. A work cycle of the pixel circuit also includes a display period and a sensing period (or blanking period). When performing external compensation, the gate driving circuit needs to provide a display output signal for the data writing transistor in a display period of one frame, and the gate driving circuit needs to provide a blanking output signal for the sensing transistor in a blanking period of the one frame.

In the OLED display panel, a shift register unit of a Gate-driver on Array (GOA) includes a detection sub-circuit, a display scanning sub-circuit, and a connection sub-circuit (or gate circuit or Hiz circuit) outputting a composite pulse of the detection sub-circuit and the display scanning sub-circuit. In this case, the shift register unit can output an output pulse having a composite waveform including two waveforms with different widths and timings, thereby providing the display output signal and the blanking output signal for the data writing transistor and the sensing transistor in the pixel circuit, respectively. However, a structure of the shift register unit is very complex and a size of the shift register unit is large, which is not conducive to achieving high resolution and narrow frame, and is also not conducive to reducing chip area to reduce cost.

At present, blanking output signals output by the gate driving circuit are sequentially scanned row by row, for example, a blanking output signal for driving pixel units in a first row in the display panel is output during a blanking period of a first frame, a blanking output signal for driving pixel units in a second row in the display panel is output during a blanking period of a second frame, and so on, thus completing row-by-row sequential compensation of the display panel. Long-time row-by-row sequential compensation brings about two serious problems: one is that there will be a scanning line that moves row by row in a process of multi-frame scanning display, and the other is that brightness of different regions on the display panel will vary greatly due to the difference in compensation time.

In addition, the shift register unit of the gate driving circuit includes a plurality of thin film transistors. Due to a threshold loss of signals output by the thin film transistors, a pulse signal output by the shift register unit is inaccurate, thus affecting a display effect and reducing a display quality.

At least some embodiments of the present disclosure provide a shift register unit and a driving method thereof, a gate driving circuit, and a display device. The shift register unit includes a first input circuit, a second input circuit, an output circuit, and a compensation circuit. The first input circuit is connected to a first node, and is configured to write a first input signal to the first node in response to a first control signal; the second input circuit is connected to the first node and a second node, and is configured to input a second input signal to the second node in response to a detection control signal and configured to transmit a level of the second node to the first node in response to a second control signal; the compensation circuit is connected to the second node, and is configured to compensate the level of the second node; and the output circuit is connected to the first node and an output terminal, and is configured to output a composite output signal to the output terminal under control of a level of the first node.

A circuit structure of the shift register unit is simple, the shift register unit can compensate the threshold voltage loss of a level written to the first node during a blanking period, thereby preventing an output signal from being affected due to the threshold voltage loss of the transistor and enhancing the reliability of the circuit. At the same time, the shift register unit can also achieve random compensation so as to avoid brightness deviation of the scanning line and a panel caused by row-by-row sequential compensation, and improve the display uniformity and the display effect.

It should be noted that in the embodiments of the present disclosure, "random compensation" represents an external compensation method different from row-by-row sequential compensation, in the random compensation method, a blanking output signal corresponding to pixel units in any one row of a display panel can be randomly output during a blanking period of a certain frame, and the above case can be applied to the following embodiments and will not be described again.

In addition, in the embodiments of the present disclosure, "one frame", "each frame", or "a certain frame" includes a display period and a blanking period that are sequentially performed, for example, in the display period, the gate driving circuit outputs a plurality of display output signals, and the plurality of display output signals can drive the display panel to complete a scanning display of a complete image from a first row to a last row, and in the blanking period, the gate driving circuit outputs a blanking output signal, and the blanking output signal can be used to drive a sensing transistors in pixel units in a certain row of the display panel to complete external compensation of the pixel units in the certain row.

Some embodiments of the present disclosure will be described in detail below with reference to the accompanying drawings, but the present disclosure is not limited to these specific embodiments.

Figure 2A:
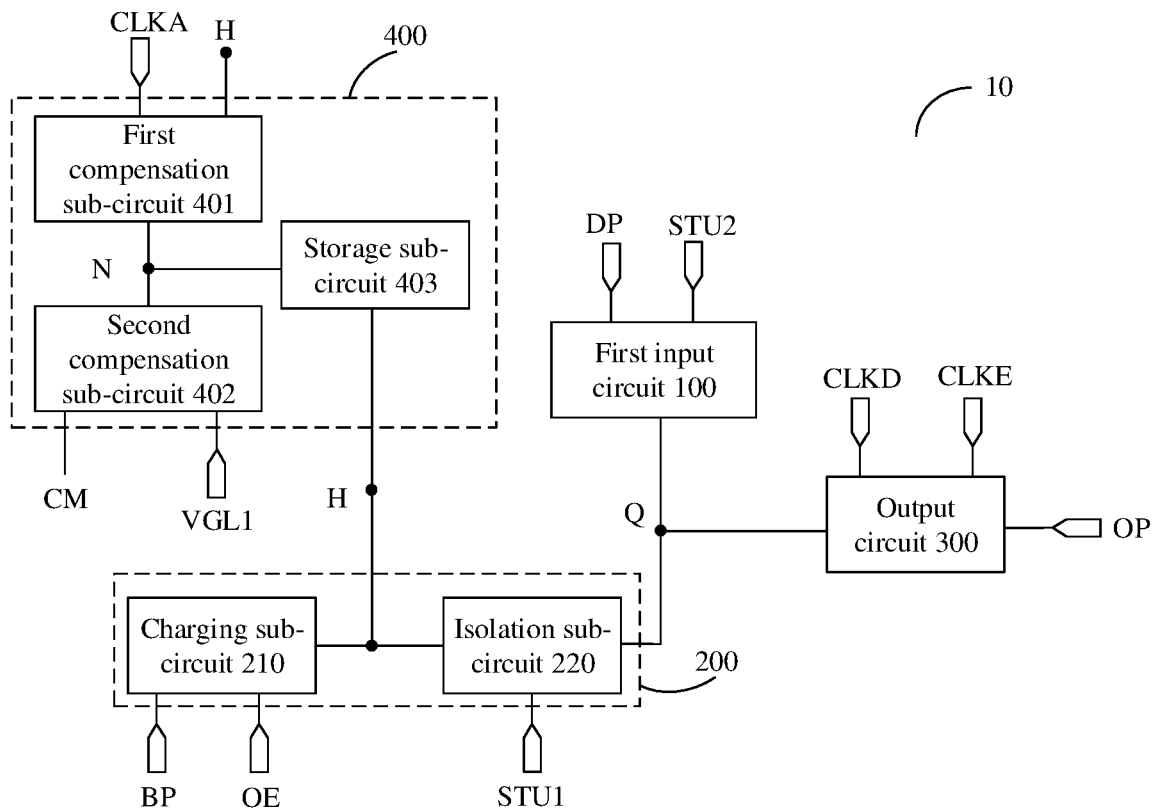
FIG. 2A is a schematic block diagram of another shift register unit provided by some embodiments of the present disclosure.
Figure 2B:
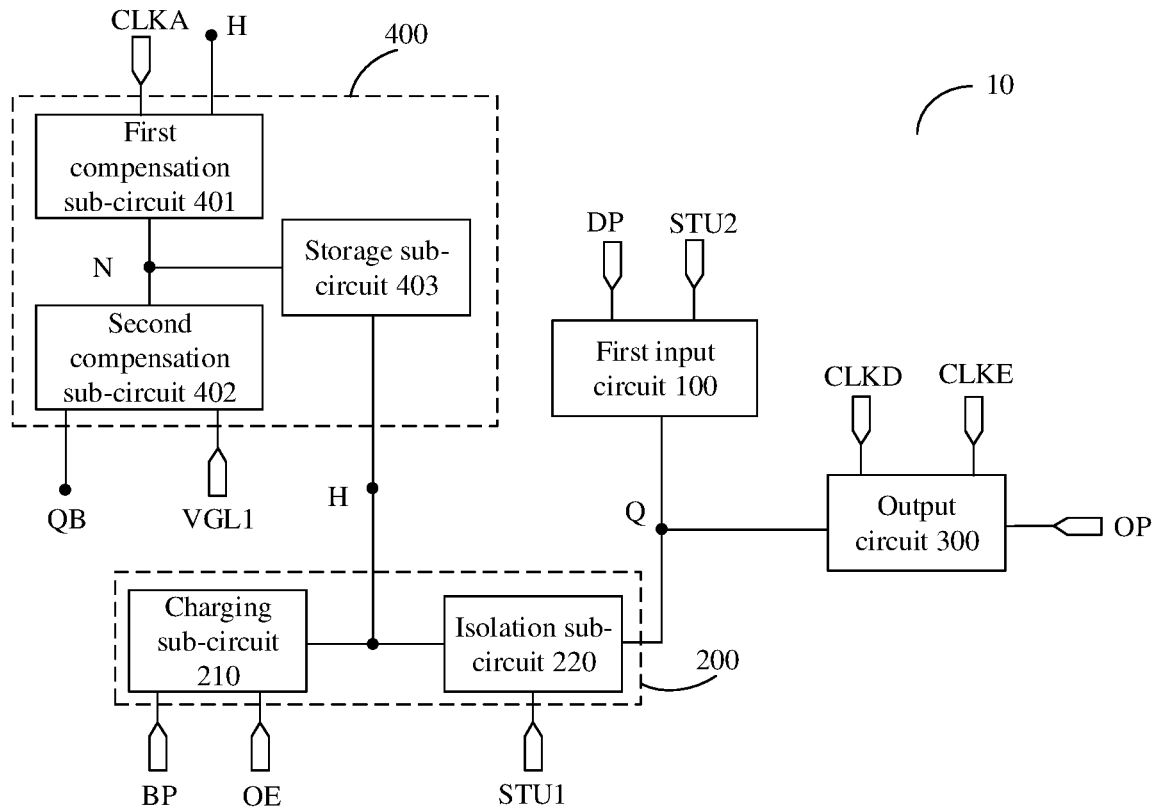
FIG. 2B is a schematic block diagram of yet another shift register unit provided by some embodiments of the present disclosure.

FIG. 1 is a schematic block diagram of a shift register unit provided by some embodiments of the present disclosure, FIG. 2A is a schematic block diagram of another shift register unit provided by some embodiments of the present disclosure, and FIG. 2B is a schematic block diagram of yet another shift register unit provided by some embodiments of the present disclosure.

For example, as shown in FIG. 1, a shift register unit 10 may include a first input circuit 100, a second input circuit 200, an output circuit 300, and a compensation circuit 400. A gate driving circuit can be obtained by cascading a plurality of shift register units 10, and the gate driving circuit is used for driving the display panel and sequentially providing scanning signals for a plurality of gate lines of the display panel, thereby performing progressive or interlaced scanning and the like during a period when the display panel displays a frame of pictures.

For example, as shown in FIG. 1, the first input circuit 100 is connected to a first node Q and is configured to write a first input signal to the first node Q (e.g., here, the first node Q is a pull-up node) in response to a first control signal. For example, in some examples, the first input circuit 100 is connected to a first input signal terminal DP, a first control signal terminal STU2, and the first node Q. Under control of the first control signal provided by the first control signal terminal STU2, in the case where the first input circuit 100 is turned on, the first input signal terminal DP is connected to the first node Q, so that the first input signal provided by the first input signal terminal DP is written to the first node Q, thereby controlling a level of the first node Q, for example, thereby pulling up a potential of the first node Q to an operation potential.

For example, the second input circuit 200 is connected to the first node Q and a second node H, and is configured to input a second input signal to the second node H in response to a detection control signal, and to transmit a level of the second node H to the first node Q in response to a second control signal. For example, in some examples, the second input circuit 200 is connected to a second input signal terminal BP, a second control signal terminal STU1, and a detection control signal terminal OE, and is configured to control the level of the second node H by the second input signal under control of the detection control signal provided by the detection control signal terminal OE, for example, the second input circuit 200 is configured to charge the second node H, and then transmit the level of the second node H to the first node Q according to the second control signal provided by the second control signal terminal STU1, thereby pulling up the potential of the first node Q to an operation potential.

For example, the second input circuit 200 may charge the second node H with the second input signal during a display period of an (N)-th frame and transmit the level of the second node H to the first node Q according to the second control signal during a blanking period of the (N)-th frame. For another example, the second input circuit 200 may also charge the second node H with the second input signal during the blanking period of the (N)-th frame and transmit the level of the second node H to the first node Q according to the second control signal during a blanking period of a (N+1)-th frame. The embodiments of the present disclosure are not limited thereto.

For example, as shown in FIG. 1, the output circuit 300 is connected to the first node Q and an output terminal OP, and is configured to output a composite output signal to the output terminal OP under control of the level of the first node Q. For example, in some examples, the output circuit 300 may also be connected to a first output clock signal terminal CLKD. Under the control of the level of the first node Q, in the case where the output circuit 300 is turned on, a first output clock signal provided by the first output clock signal terminal CLKD is output to the output terminal OP via different transistors respectively and serves as a first output signal and a second output signal. The composite output signal includes the first output signal and the second output signal, the first output signal is identical to the second output signal. The second output signal can be used to drive pixel unis in the display panel for display or to achieve external compensation. In the case where the plurality of shift register units 10 are cascaded, the first output signal may be used for scanning shift of upper and lower shift register units.

For example, as shown in FIG. 1, the compensation circuit 400 is connected to the second node H and is configured to compensate the level of the second node H. For example, the compensation circuit 400 may compensate the level of the second node H in the blanking period of the (N)-th frame, so as to compensate for the influence of factors, such as the threshold voltage loss, on the level of the second node H, thereby improving the control for the level of the second node H.

For example, as shown in FIG. 2A, in some examples, the compensation circuit 400 includes a first compensation sub-circuit 401, a second compensation sub-circuit 402, and a storage sub-circuit 403. The first compensation sub-circuit 401 is connected to the second node H and a third node N, respectively, and is configured to write a first clock signal to the third node N under control of the level of the second node H; the storage sub-circuit 403 is connected to the second node H and the third node N, respectively, and is configured to compensate the level of the second node H based on the first clock signal written to the third node N; and the second compensation sub-circuit 402 is connected to the third node N, and is configured to perform noise reduction on the third node N under control of a compensation noise reduction signal CM.

For example, as shown in FIG. 2B, in some embodiments, the second compensation sub-circuit 402 is also connected to a fourth node QB to receive a voltage of the fourth node QB as the compensation noise reduction signal CM. That is, under control of a level of the fourth node QB, the second compensation sub-circuit 402 can perform noise reduction on the third node N. Therefore, it is not necessary to separately provide a single signal line for the second compensation sub-circuit 402 to provide the compensation noise reduction signal CM, thus saving the amount of signal lines.

It should be noted that in other examples, the second compensation sub-circuit 402 may also be connected to a separately provided compensation noise reduction signal terminal configured to output the compensation noise reduction signal CM. The present disclosure is not specifically limited thereto.

For example, in some examples, the first compensation sub-circuit 401 is also connected to a first clock signal terminal CLKA. Under the control of the level of the second node H, in the case where the first compensation sub-circuit 401 is turned on, the first clock signal provided by the first clock signal terminal CLKA can be written to the third node N. The second compensation sub-circuit 402 is also connected to a first voltage terminal VGL1. Under the control of the compensation noise reduction signal CM (i.e., the level of the fourth node QB), in the case where the second compensation sub-circuit 402 is turned on, a first voltage provided by the first voltage terminal VGL1 can be written to the third node N to achieve to perform noise reduction on the third node N.

In the case where the shift register unit does not include the compensation circuit 400, because the transistor has a threshold voltage loss, there is a problem of the threshold voltage loss in the case where the second input signal is input to the second node H via the second input circuit 200, thus resulting in that a signal of the second node H is not equal to the second input signal; then, when writing the level of the second node H to the first node Q, there is also the problem of the threshold voltage loss, that is, after two threshold voltage losses, the second input signal finally is transmitted to the first node Q, thereby resulting in a large difference between the level of the first node Q and the second input signal, and a high level written to the first node Q will be lower than a predetermined value, thus affecting the composite output signal output by the output terminal OP. The shift register unit 10 provided by the embodiment of the present disclosure includes the compensation circuit 400, and the compensation circuit 400 can compensate the level of the second node H in the blanking period of one frame, thereby solving the problem of the threshold voltage loss at the second node H, so that the signal at the second node H is greater than or equal to the second input signal, whereby after the second input circuit 200 writes the level of the second node H into the first node Q, the level of the first node Q can reach the predetermined value, which solves the problem that the high level at the first node Q will be lower than the predetermined value due to the threshold voltage loss, thus preventing the quality of the output signal from being affected due to the threshold voltage loss of the transistor and enhancing the reliability of the circuit.

In the shift register unit 10 provided by some embodiments of the present disclosure, the first input circuit 100 (implemented as the display scanning sub-circuit), the output circuit 300 (implemented as the connection sub-circuit), and the second input circuit 200 (implemented as the detection sub-circuit) may be integrated. In the case where the display panel is driven by the gate driving circuit obtained by cascading the plurality of shift register units 10, the blanking output signal in the blanking period and the display output signal in the display period of one frame of picture can be output through the same output circuit, thereby simplifying circuit structures of the shift register unit and the gate driving circuit obtained and reducing the sizes of the shift register unit and the gate driving circuit including the shift register unit.

For example, as shown in FIGS. 2A and 2B, the output circuit 300 may also be connected to a second output clock signal terminal CLKE. Under the control of the level of the first node Q, in the case where the output circuit 300 is turned on, the second output clock signal provided by the second output clock signal terminal CLKE is output to the output terminal OP and serves as a third output signal. The composite output signal further includes the third output signal. The second output signal and the third output signal may be two mutually independent waveforms having different widths and timings.

For example, the first input circuit 100 is configured to pull up a potential of the first node Q to an operation potential in the display period of one frame, and the second input circuit 200 is configured to pull up the potential of the first node Q to an operation potential in the blanking period of one frame. For example, in the display period of one frame, the output circuit 300 outputs the second output signal and the third output signal via the output terminal OP under the control of the level of the first node Q to drive the scanning transistors in the corresponding pixel units through the gate lines connected thereto, thereby performing display; and in the blanking period of one frame, the output circuit 300 outputs the second output signal and/or the third output signal via the output terminal OP under the control of the level of the first node Q to drive the sensing transistor in the pixel unit, thereby performing compensation detection.

For example, as shown in FIGS. 2A and 2B, the second input circuit 200 may include a charging sub-circuit 210 and an isolation sub-circuit 220.

For example, the charging sub-circuit 210 is configured to input the second input signal to the second node H in response to the detection control signal. For example, in some examples, the charging sub-circuit 210 is connected to the second node H, the detection control signal terminal OE, and the second input signal terminal BP. Under the control of the detection control signal provided by the detection control signal terminal OE, in the case where the charging sub-circuit 210 is turned on, the second input signal terminal BP is connected to the second node H, thereby writing the second input signal to the second node H. For example, in an example, under the control of the detection control signal, in the case where the charging sub-circuit 210 is turned on, the second input signal may be at a high level to charge the second node H.

For example, the detection control signal may be a random signal. In some examples, the detection control signal terminal OE is connected to an external control circuit, the external control circuit may provide the detection control signal to the detection control signal terminal OE, and the detection control signal is a random signal. The external control circuit may be implemented by using, for example, a Field Programmable Gate Array (FPGA) or other signal generation circuit, thereby outputting an appropriate type random signal as the detection control signal. For example, the external control circuit may be configured to output a random signal to the detection control signal terminal OE during the display period of one frame. For example, in some examples, the external control circuit may be connected to shift signal output terminals of shift register units of all stages. According to actual needs, the external control circuit may randomly select a signal of a shift signal output terminal of a certain shift register unit during the display period of one frame and transmit the signal to detection control signal terminals OE of the shift register units of all stages.

For example, the output terminal OP may include a shift signal output terminal. In some examples, a second input signal terminal BP of an (i+2)-th stage shift register unit may be connected to a shift signal output terminal of an (i)-th stage shift register unit, so that a signal output from the shift signal output terminal of the (i)-th stage shift register unit may serve as a second input signal of the (i+2)-th shift register unit. In the case where random detection is performed, pixel units in an (i+2)-th row of the display panel need to be detected in the (N)-th frame. The pixel units in the (i+2)-th row correspond to the (i+2)-th stage shift register unit. In the display period of the (N)-th frame, the external control circuit is used to transmit the signal output from the shift signal output terminal of the (i)-th stage shift register unit to the detection control signal terminals OE of shift register units of all stages, i.e. the detection control signals of shift register units of all stages may have the same waveform pulse width and timing as the signal output from the shift signal output terminal of the (i)-th stage shift register unit. In the case where the waveforms of the output signals do not overlap, under the control of the detection control signal terminal OE, only the charging sub-circuit 210 in the (i+2)-th stage shift register unit can transmit the high-level second input signal to the second node H, so that the second node H is charged to the high level. Thus, in the blanking period of the (N)-th frame, the high-level signal of the second node H of the (i+2)-th stage shift register unit can be transmitted to the first node Q, so that an output circuit 300 of the (i+2)-th stage shift register unit can output a blanking output signal for driving the sensing transistors of the pixel units in the (i+2)-th row. And, i is a positive integer.

For example, the shift register unit provided by some embodiments of the present disclosure can also implement row-by-row sequential compensation. When performing row-by-row sequential compensation, in some examples, a second input signal terminal BP of a current stage shift register unit may be connected to a shift signal output terminal CR of the current stage shift register unit, the detection control signal terminals OE of the shift register units of all stages receives a signal of a shift signal output terminal CR of a first stage shift register unit during a display period of a first frame, the detection control signal terminals OE of the shift register units of all stages receive a signal output from a shift signal output terminal CR of a second stage shift register unit during a display period of a second frame, and so on, therefore, a second node H of the first stage shift register unit can be charged to a high level during the display period of the first frame, and a second node H of the second stage shift register unit can be charged to a high level during the display period of the second frame, so that the display panel can achieve row-by-row sequential compensation.

For example, the isolation sub-circuit 220 is connected to the first node Q and the second node H, respectively, and is configured to transmit the level of the second node H to the first node Q under the control of the second control signal. For example, the isolation sub-circuit 220 is disposed between the first node Q and the second node H and is used for preventing the mutual influence of the first node Q and the second node H. For example, in the case where it is not necessary to transmit the level of the second node H to the first node Q, the isolation sub-circuit 220 may disconnect an electrical connection between the first node Q and the second node H.

For example, in some examples, the isolation sub-circuit 220 is connected to the first node Q, the second node H, and the second control signal terminal STU1, and is configured to be turned on under the control of the second control signal provided by the second control signal terminal STU1, so that the first node Q is connected to the second node H, thereby transmitting the level of the second node H to the first node Q. For example, in an example, in the case where the isolation sub-circuit 220 is turned on under the control of the second control signal, the level of the second node H is a high level, thereby pulling up the potential of the first node Q to an operation potential.

For example, in some embodiments, the first clock signal is identical to the second control signal, and the first clock signal terminal CLKA is equivalent to the aforementioned second control signal terminal STU1, that is, the second control signal terminal STU1 and the first clock signal terminal CLKA are the same signal terminal. The isolation sub-circuit 220 and the first compensation sub-circuit 401 are connected to the same signal terminal, such as the first clock signal terminal CLKA, so that the isolation sub-circuit 220 can transmit the level of the second node H to the first node Q under the control of the first clock signal provided by the first clock signal terminal CLKA; meanwhile, the first compensation sub-circuit 401 may write the first clock signal to the third node N.

It should be noted that in various embodiments of the present disclosure, the second input circuit 200 may include any suitable sub-circuit, and is not limited to the above-mentioned charging sub-circuit 210 and isolation sub-circuit 220, as long as corresponding functions can be achieved. In addition, other circuit structures of the shift register unit 10 as shown in FIGS. 2A and 2B are basically the same as the circuit structure of the shift register unit 10 as shown in FIG. 1, and repetition will not be repeated herein.

Figure 3A:
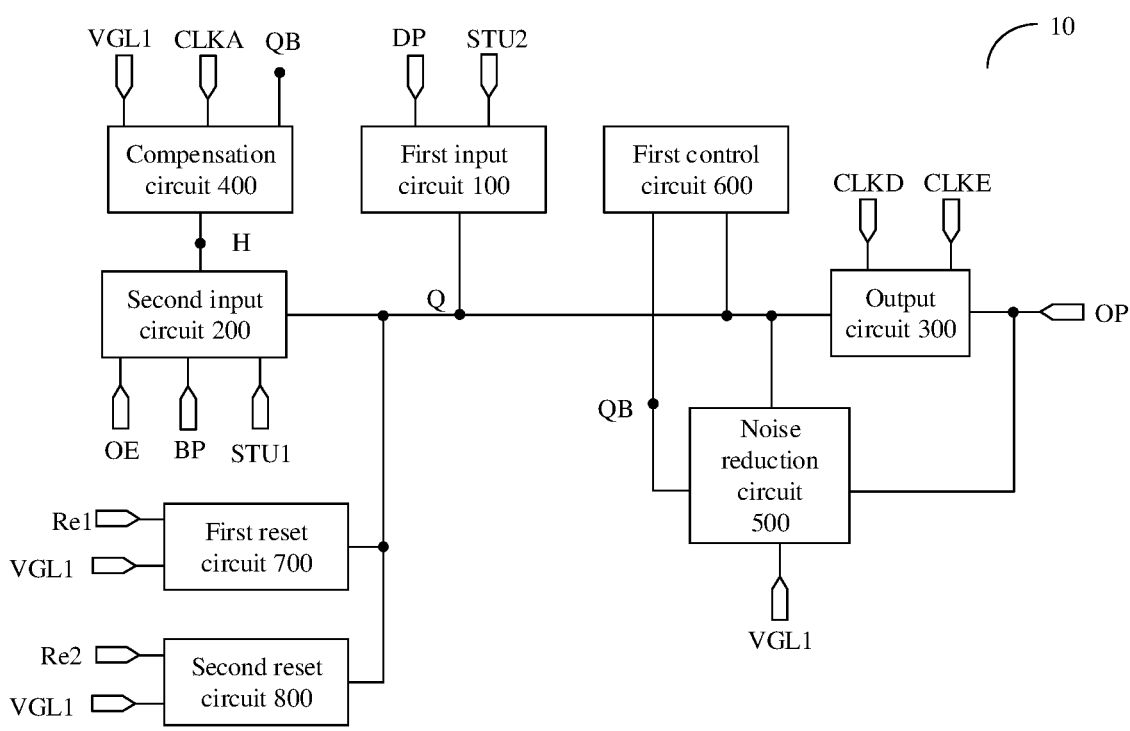
FIG. 3A is a schematic block diagram of a shift register unit provided by other embodiments of the present disclosure.
Figure 3B:
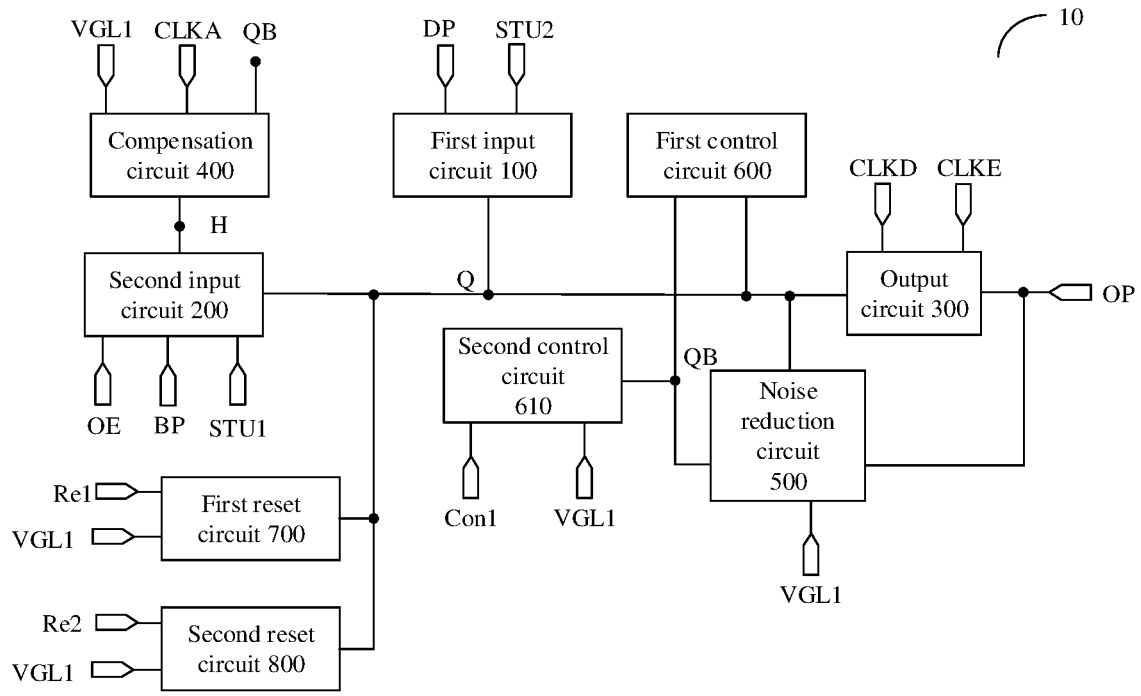
FIG. 3B is a schematic block diagram of another shift register unit provided by other embodiments of the present disclosure.
Figure 3C:
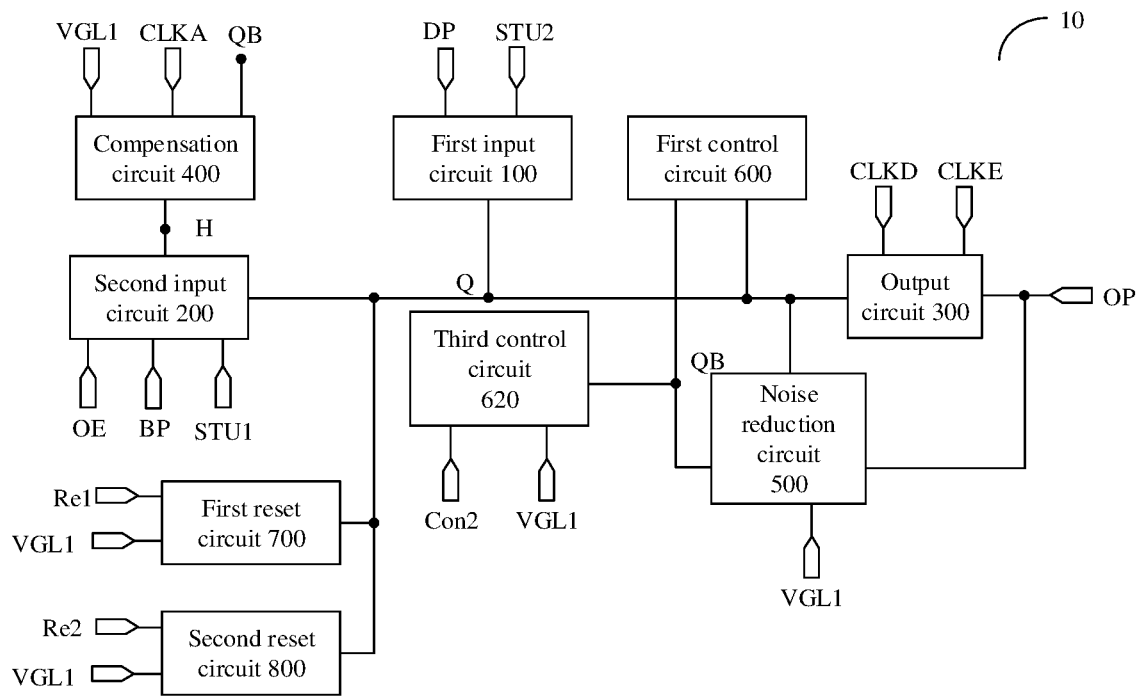
FIG. 3C is a schematic block diagram of yet another shift register unit provided by other embodiments of the present disclosure.
Figure 3D:
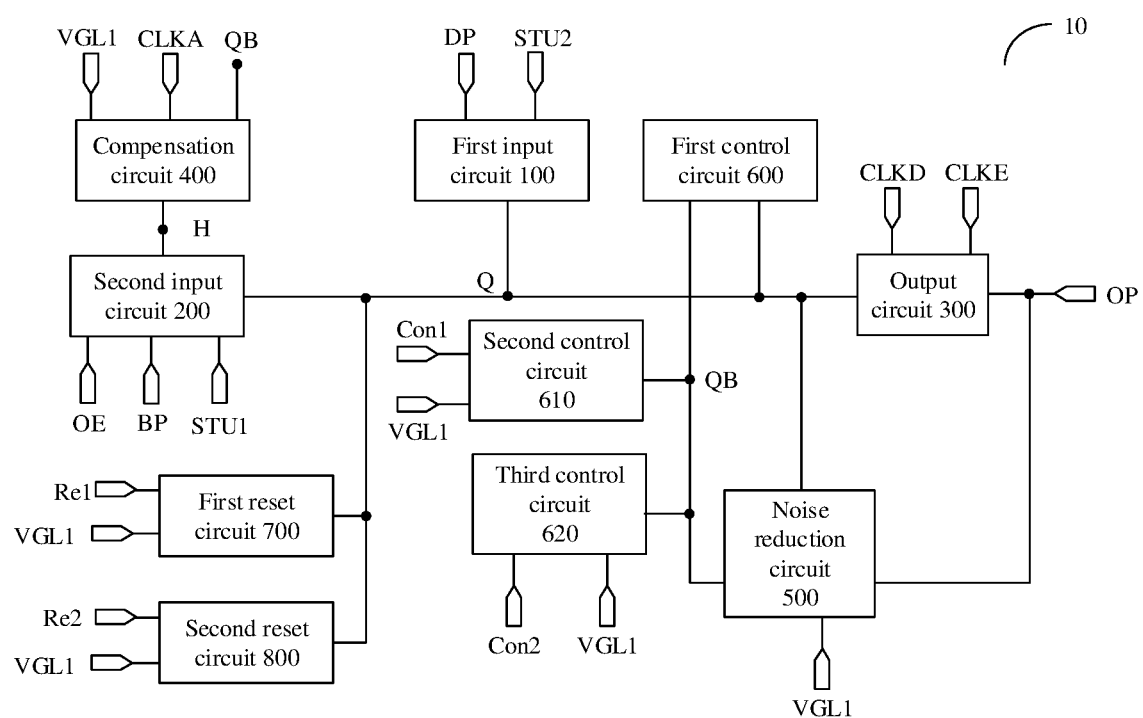
FIG. 3D is a schematic block diagram of still another shift register unit provided by other embodiments of the present disclosure.

FIG. 3A is a schematic block diagram of a shift register unit provided by other embodiments of the present disclosure; FIG. 3B is a schematic block diagram of another shift register unit provided by other embodiments of the present disclosure; FIG. 3C is a schematic block diagram of yet another shift register unit provided by other embodiments of the present disclosure; FIG. 3D is a schematic block diagram of still another shift register unit provided by other embodiments of the present disclosure.

For example, as shown in FIG. 3A, the shift register unit further includes a noise reduction circuit 500 (here, a pull-down circuit) and a first control circuit 600.

For example, the noise reduction circuit 500 is connected to the first node Q, the fourth node QB (here, the fourth node QB is a pull-down node), and the output terminal OP, and is configured to simultaneously perform noise reduction on the first node Q and the output terminal OP under the control of the level of the fourth node QB. For example, in some examples, the noise reduction circuit 500 is connected to the first node Q, the fourth node QB, the output terminal OP, and the first voltage terminal VGL1. Under control of the level of the fourth node QB, in the case where the noise reduction circuit 500 is turned on, the first node Q and the output terminal OP are both connected to the first voltage terminal VGL1, so that the first node Q and the output terminal OP are pulled down to a non-operation potential through the first voltage terminal VGL1 to achieve to perform noise reduction on the first node Q and the output terminal OP.

It should be noted that in the embodiments of the present disclosure, the first voltage terminal VGL1 may be configured to provide a DC low-level signal, for example. These described herein can be applied to the following embodiments and will not be described again.

For example, the first control circuit 600 is configured to control the level of the fourth node QB under the control of the level of the first node Q. For example, the first control circuit 600 is connected to both the first node Q and the fourth node QB, and is configured to pull down the level of the fourth node QB to a low level in the case where the first node Q is at a high level and pull up the fourth node QB to a high level in the case where the first node Q is at a low level. For example, the first control circuit 600 may be an inverting circuit.

For example, as shown in FIG. 3B, the shift register unit 10 further includes a second control circuit 610. The second control circuit 610 is configured to control the level of the fourth node QB in response to the third control signal. For example, the second control circuit 610 is connected to the fourth node QB, the third control signal terminal Con1, and the first voltage terminal VGL1. For example, in the blanking period of one frame, under the control of the third control signal provided by the third control signal terminal Con1, in the case where the second control circuit 610 is turned on, the fourth node QB is connected to the first voltage terminal VGL1, and the level of the fourth node QB is pulled down to the non-operation potential through the first voltage terminal VGL1, so that in the blanking period, the fourth node QB can be ensured to be at the low level, the influence of the fourth node QB on the first node Q is reduced, so that the high level of the first node Q reaches a predetermined value, thus preventing the output signal from being affected after the threshold voltage of the transistor drifts, and enhancing the reliability of the circuit.

For example, in some embodiments, the third control signal includes a first clock signal, that is, in this example, the first clock signal terminal CLKA for providing the first clock signal is equivalent to the aforementioned third control signal terminal Con1, that is, the third control signal terminal Con1 and the first clock signal terminal CLKA are the same signal terminal.

For example, in other embodiments, the third control signal includes the first clock signal and a voltage of the second node H, so that the second control circuit 610 is also connected to the second node H. Therefore, in the blanking period of one frame, under the control of the voltage of the second node H and the first clock signal, the second control circuit 610 is turned on to pull down the fourth node QB to ensure that the fourth node QB is at a low level.

For example, as shown in FIG. 3C, the shift register unit 10 further includes a third control circuit 620. The third control circuit 620 is configured to control the level of the fourth node QB in response to a fourth control signal. For example, in an example, the third control circuit 620 is connected to a fourth control signal terminal Con2, the fourth node QB, and the first voltage terminal VGL1. In the display period of one frame, under control of the fourth control signal provided by the fourth control signal terminal Con2, in the case where the third control circuit 620 is turned on, the fourth node QB is connected to the first voltage terminal VGL1, and the level of the fourth node QB is pulled down to a non-operation potential through the first voltage terminal VGL1, thereby reducing the influence of the fourth node QB on the first node Q in the display period, enabling the high level of the first node Q to reach the predetermined value, preventing the output signal from being affected after the threshold voltage of the transistor drifts, and enhancing the reliability of the circuit.

For example, as shown in FIG. 3D, unlike the examples as shown in FIGS. 3B and 3C, the shift register unit 10 may also include both the second control circuit 610 and the third control circuit 620. In the blanking period of one frame, under the control of the third control signal provided by the third control signal terminal Con1, in the case where the second control circuit 610 is turned on, the fourth node QB is connected to the first voltage terminal VGL1, and the level of the fourth node QB is pulled down to a non-operation potential through the first voltage terminal VGL1. In the display period of one frame, the third control circuit 620 is configured to be turned on under the control of the fourth control signal provided by the fourth control signal terminal Con2, the fourth node QB is connected to the first voltage terminal VGL1, and the level of the fourth node QB is pulled down to a non-operation potential through the first voltage terminal VGL1. Thus, in the example as shown in FIG. 3D, the level of the fourth node QB can be pulled down to the non-operation potential in both the blanking period and the display period, thereby reducing the influence of the fourth node QB on the first node Q, so that the high level of the first node Q reaches a predetermined value.

For example, as shown in FIGS. 3A-3D, the shift register unit 10 further includes a first reset circuit 700 (here, a display reset circuit) and a second reset circuit 800 (here, a blanking reset circuit).

For example, the first reset circuit 700 is configured to reset the first node Q in response to a first reset control signal. For example, as shown in FIGS. 3A-3D, the first reset circuit 700 is connected to a first reset control signal terminal Re1, the first node Q, and the first voltage terminal VGL1. Under control of the first reset control signal provided by the first reset control signal terminal Re1, in the case where the first reset circuit 700 is turned on, the first node Q is connected to the first voltage terminal VGL1, thereby resetting the first node Q with the first voltage of the first voltage terminal VGL1. For example, in the display period of one frame, after the output circuit 300 outputs signals (e.g., the first output signal, the second output signal, and the third output signal), the first node Q is reset by the first voltage of the first voltage terminal VGL1.

For example, the second reset circuit 800 is configured to reset the first node Q in response to a second reset control signal. For example, as shown in FIGS. 3A-3D, the second reset circuit 800 is connected to a second reset control signal terminal Re2, the first node Q, and the first voltage terminal VGL1. Under control of the second reset control signal provided by the second reset control signal terminal Re2, in the case where the second reset circuit 800 is turned on, the first node Q is connected to the first voltage terminal VGL1, thereby resetting the first node Q by the first voltage of the first voltage terminal VGL1. For example, in the blanking period of one frame, after the output circuit 300 outputs signal output signals (e.g., the first output signal, the second output signal, and the third output signal), the first node Q is reset by the first voltage of the first voltage terminal VGL1; and for another example, before the display period of one frame, the second reset circuit 800 may be turned on in response to the second reset control signal, so that the first node Q may be reset by the first voltage of the first voltage terminal VGL1.

It is worth noting that in the example as shown in FIGS. 3A-3D, the first control circuit 600, the second control circuit 610, the third control circuit 620, the first reset circuit 700, and the second reset circuit 800 are all connected to the first voltage terminal VGL1 to receive a DC low-level signal, but the present disclosure is not limited thereto. The first control circuit 600, the second control circuit 610, the third control circuit 620, the first reset circuit 700, and the second reset circuit 800 may also be connected to different power supply voltage terminals respectively to receive different low-level signals. As long as corresponding functions can be achieved, the present disclosure is not particularly limited to this case.

It should be noted that other circuit structures of the shift register unit 10 as shown in FIGS. 3A-3D are basically the same as the circuit structure of the shift register unit 10 as shown in FIG. 2B, and repetition is not repeated herein.

Figure 4A:
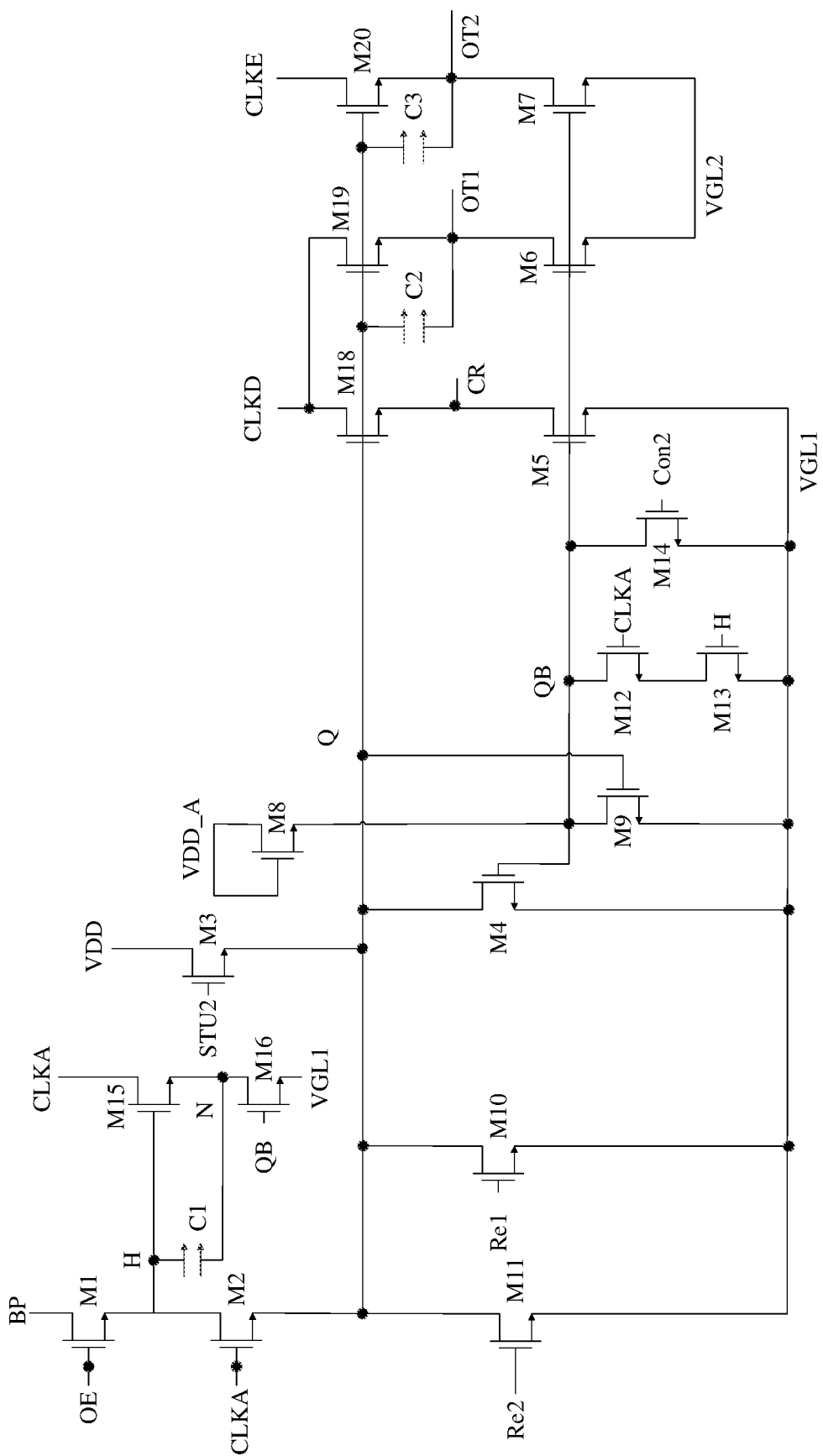
FIG. 4A is a circuit structure diagram of the shift register unit as shown in FIG. 3D.
Figure 4B:
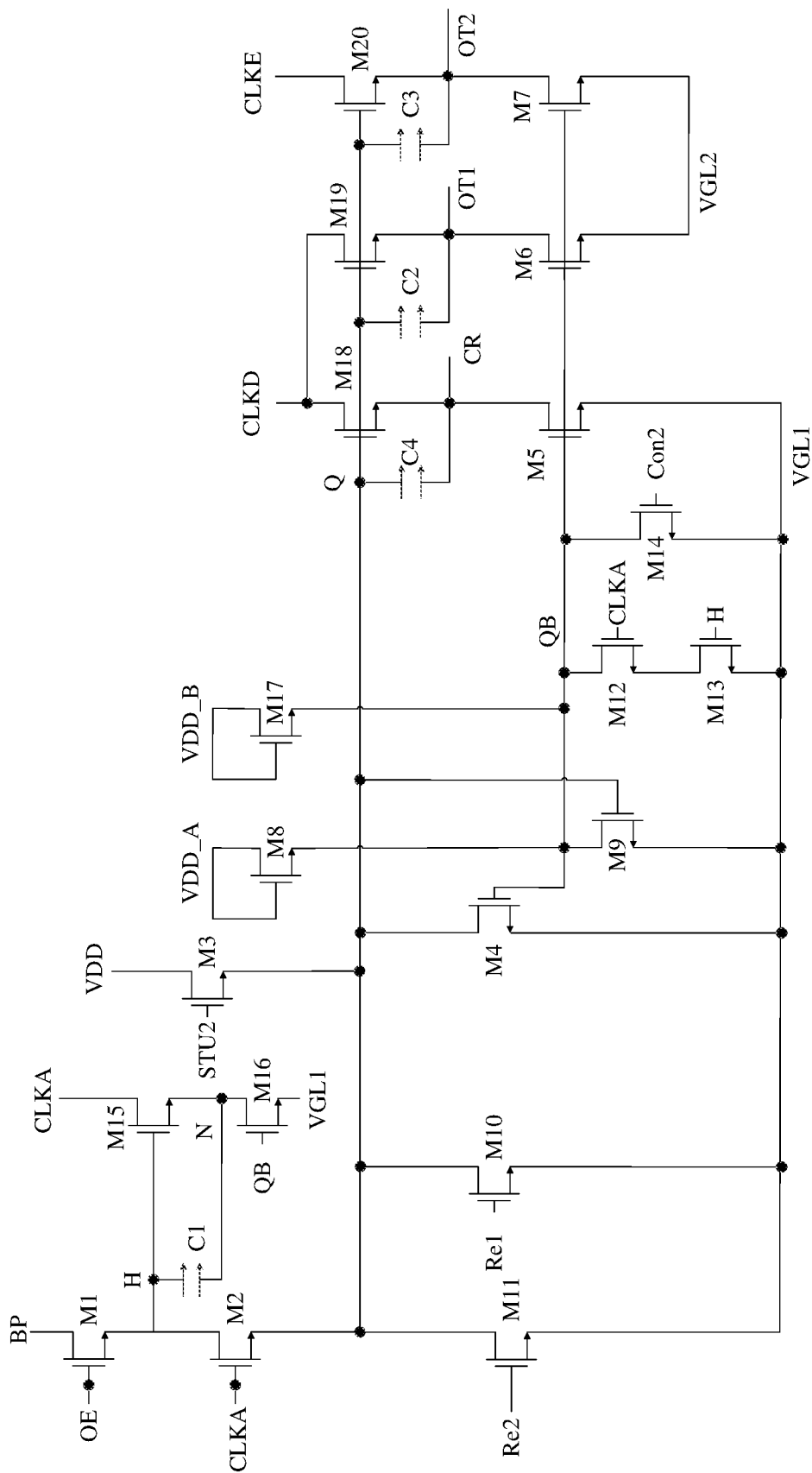
FIG. 4B is another circuit structure diagram of the shift register unit as shown in FIG. 3D.

FIG. 4A is a circuit structure diagram of the shift register unit as shown in FIG. 3D, and FIG. 4B is another circuit structure diagram of the shift register unit as shown in FIG. 3D. In the following description of the present disclosure, it is described by taking a case that respective transistors are N-type transistors as an example, but the embodiments of the present disclosure are not limited thereto.

For example, as shown in FIGS. 4A and 4B, the first compensation sub-circuit 401 includes a first compensation transistor M15, the second compensation sub-circuit 402 includes a second compensation transistor M16, and the storage sub-circuit 403 includes a first capacitor C1.

For example, as shown in FIGS. 4A and 4B, in some examples, a first electrode of the first compensation transistor M15 is connected to the first clock signal terminal CLKA to receive the first clock signal, a second electrode of the first compensation transistor M15 is connected to the third node N, and a gate electrode of the first compensation transistor M15 is connected to the second node H. A first terminal of the first capacitor C1 is connected to the second node H, and a second terminal of the first capacitor C1 is connected to the third node N. A first electrode of the second compensation transistor M16 is connected to the third node N, a second electrode of the second compensation transistor M16 is connected to the first voltage terminal VGL1, and a gate electrode of the second compensation transistor M16 is configured to receive the compensation noise reduction signal CM. For example, in some examples, the gate electrode of the second compensation transistor M16 is connected to the fourth node QB to receive the voltage of the fourth node QB as the compensation noise reduction signal CM. For example, if the second compensation transistor M16 is an N-type transistor, in the case where the level of the fourth node QB is a high level, the second compensation transistor M16 is turned on to transmit the first voltage of the first voltage terminal VGL1 to the third node N, thereby performing noise reduction on the third node N; and in the case where the level of the fourth node QB is a low level, the second compensation transistor M16 is turned off.

For example, the first voltage terminal VGL1 is configured to provide the first voltage. In some examples, the first voltage may be a DC low-level signal. The following embodiments are the same as this case, and similar portions will not be described again. It should be noted that in other examples, in the case where all transistors in the shift register unit are P-type transistors, the first voltage may also be a DC high-level signal.

For example, as shown in FIGS. 4A and 4B, the charging sub-circuit 210 includes a first transistor M1, and the isolation sub-circuit 220 includes a second transistor M2.

For example, a gate electrode of the first transistor M1 is configured to receive the detection control signal OE, a first electrode of the first transistor M1 is configured to receive the second input signal, and a second electrode of the first transistor M1 is connected to the second node H. For example, the first electrode of the first transistor M1 is connected to the second input signal terminal BP, and the second input signal terminal BP is used for providing the second input signal.

For example, a gate electrode of the second transistor M2 is configured to receive the second control signal, a first electrode of the second transistor M2 is connected to the second node H, and a first electrode of the second transistor M2 is connected to the first node Q. For example, in some examples, the gate electrode of the second transistor M2 is connected to the first clock signal terminal CLKA to receive the first clock signal as the second control signal, i.e., the first clock signal is identical to the second control signal. The embodiments of the present disclosure are not limited to this case, and in another example, the first clock signal and the second control signal may also be different.

For example, due to threshold voltage losses of transistors (e.g., the first transistor M1 and the second transistor M2 as shown in FIGS. 4A and 4B), in the case where the second input signal is written to the second node H through the first transistor M1, due to the threshold voltage loss of the first transistor M1, a voltage written to the second node H is $V_H$, $V_H = Vin2 - Vth1$, where Vin2 is the second input signal, and Vth1 is a threshold voltage of the first transistor M1. $V_H$ is less than Vin2. Then, in a case of writing the level of the second node H to the first node Q through the second transistor M2, due to the threshold voltage loss of the second transistor M2, a voltage written to the first node Q is $V_Q$, $V_Q = Vin2 - Vth1 - Vth2$, where Vth2 is a threshold voltage of the second transistor M2. After two threshold voltage losses, the voltage $V_Q$ of the first node Q differs greatly from the second input signal Vin2, and a high level written to the first node Q will be lower than a predetermined value, thus affecting the composite output signal output by the output terminal OP.

In the shift register unit provided by the embodiments of the present disclosure, as shown in FIGS. 4A and 4B, in a case where the first compensation transistor M15 is turned on, the first clock signal provided by the first clock signal terminal CLKA is written into the third node N, and the voltage of the second node H can be compensated based on a bootstrap effect of the first capacitor C1. For example, in a case where the first transistor M1 is turned on, the second node H is charged by the second input signal, so that the level of the second node H is $V_H$, $V_H$=Vin2−Vth1; in a case where the second compensation transistor M16 is turned on, the first voltage of the first voltage terminal VGL1 is written to the third node N, so that the voltage of the third node N is the first voltage; and in the blanking period, in a case where the second compensation transistor M16 is turned off and the first compensation transistor M15 is turned on under the control of the second node H, the high level of the first clock signal is written to the third node N, i.e., the voltage of the third node N changes from the first voltage to the high level of the first clock signal. Due to the bootstrap effect of the first capacitor C1, the voltage of the second node H changes to $V'_H$, $V'_H$=Vin2−Vth1−Vgl1+Vclka, where Vgl1 is the first voltage, and Vclka is the high level of the first clock signal. At this time, the voltage $V'_H$ of the second node H is larger than the second input signal Vin2, and therefore, the level of the first node Q can reach the predetermined value after writing the level of the second node H to the first node Q.

For example, as shown in FIGS. 4A and 4B, the shift register unit 10 further includes the first control signal terminal STU2. The first input circuit 100 includes a third transistor M3. A gate electrode of the third transistor M3 is connected to the first control signal terminal STU2 to receive the first control signal, a first electrode of the third transistor M3 is configured to receive the first input signal, and a second electrode of the third transistor M3 is connected to the first node Q. For example, in some examples, the first electrode of the third transistor M3 is connected to a fourth voltage terminal VDD, the fourth voltage terminal VDD is equivalent to the aforementioned first input signal terminal DP, and the fourth voltage provided by the fourth voltage terminal VDD serves as the first input signal. In the display period of one frame, in a case where the first control signal is at an effective level (e.g., high level), the third transistor M3 is turned on, so that the fourth voltage terminal VDD is connected to the first node Q, thereby writing the fourth voltage to the first node Q, and pulling up the potential of the first node Q to an operation potential.

For example, in an example, in the case where a plurality of shift register units 10 are cascaded, a shift signal output terminal CR of an ($n_2$)-th stage shift register unit 10 is connected to a first control signal terminal STU2 of an ($n_2$+3)-th stage shift register unit 10, thereby taking an output signal of the shift signal output terminal CR of the ($n_2$)-th stage shift register unit 10 as the first control signal of the ($n_2$+3)-th stage shift register unit 10. Here, $n_2$ is an integer greater than zero. Of course, the embodiments of the present disclosure are not limited to this case, and the first control signal terminal STU2 may also be connected to a separately provided signal line.

For example, the fourth voltage may be a DC high-level signal (e.g., higher than or equal to a high-level portion of the clock signal), and the following embodiments are the same this case and similar portions will not be described again.

For example, as shown in FIG. 4A, the output terminal OP includes a shift signal output terminal CR and a first scanning signal output terminal OT1. The output circuit 300 includes a first output transistor M18, a second output transistor M19, and a second capacitor C2.

For example, a gate electrode of the first output transistor M18 is connected to the first node Q, a first electrode of the first output transistor M18 is connected to the first output clock signal terminal CLKD to receive the first output clock signal, and a second electrode of the first output transistor M18 is connected to the shift signal output terminal CR.

For example, a gate electrode of the second output transistor M19 is connected to the first node Q, a first electrode of the second output transistor M19 is connected to the first output clock signal terminal CLKD to receive the first output clock signal, and a second electrode of the second output transistor M19 is connected to the first scanning signal output terminal OT1; and a first terminal of the second capacitor C2 is connected to the first node Q, and a second terminal of the second capacitor C2 is connected to the second electrode of the second output transistor M19.

For example, in a case where the first node Q is at an operation potential (e.g., high level), both the first output transistor M18 and the second output transistor M19 are turned on, so that the first output clock signal is transmitted to the shift signal output terminal CR via the first output transistor M18 and serves as the first output signal, and the first output clock signal is transmitted to the first scanning signal output terminal OT1 via the second output transistor M19 and serves as the second output signal.

For example, the composite output signal includes the first output signal and the second output signal, and the first output signal is identical to the second output signal. For example, the second output signal includes the above-mentioned display output signal and blanking output signal, that is, in the display period, the signal output from the first scanning signal output terminal OT1 is the display output signal; and in the blanking period, the signal output from the first scanning signal output terminal OT1 is the blanking output signal.

For example, as shown in FIG. 4A, the output terminal OP further includes a second scanning signal output terminal OT2, and the output circuit 300 further includes a third output transistor M20 and a third capacitor C3.

For example, a gate electrode of the third output transistor M20 is connected to the first node Q, a first electrode of the third output transistor M20 is connected to the second output clock signal terminal CLKE to receive the second output clock signal, and a second electrode of the third output transistor M20 is connected to the second scanning signal output terminal OT2. A first terminal of the third capacitor C3 is connected to the first node Q, and a second terminal of the third capacitor C3 is connected to the second electrode of the third output transistor M20.

For example, in a case where the first node Q is at an operation potential (e.g., high level), the third output transistor M20 is turned on, and the second output clock signal is transmitted to the second scanning signal output terminal OT2 via the third output transistor M20 and serves as the third output signal. For example, the composite output signal further includes the third output signal.

For example, in an example, the clock signals provided by the first output clock signal terminal CLKD and the second output clock signal terminal CLKE are the same, so that the second output signal output by the first scanning signal output terminal OT1 and the third output signal output by the second scanning signal output terminal OT2 are the same. For example, in another example, the signal provided by the first output clock signal terminal CLKD and the signal provided by the second output clock signal terminal CLKE are different, so that the second output signal output by the first scanning signal output terminal OT1 and the third output signal output by the second scanning signal output terminal OT2 are different, so as to provide various driving signals for the pixel units.

For example, a low level of the first output clock signal may be the same as the low level of the first voltage output by the first voltage terminal VGL1. A low level of the second output clock signal may also be the same as the low level of the first voltage output by the first voltage terminal VGL1. A high level of the first output clock signal is the same as a high level of the second output clock signal.

For example, as shown in FIG. 4B, in other embodiments, the output circuit 300 further includes a fourth capacitor C4, a first terminal of the fourth capacitor C4 is connected to the first node Q, and a second terminal of the fourth capacitor C4 is connected to the second electrode of the first output transistor M18.

It should be noted that in various embodiments of the present disclosure, the first capacitor C1, the second capacitor C2, the third capacitor C3, and the fourth capacitor C4 may be capacitor devices fabricated by a process manufacturing, for example, the capacitor devices are fabricated by fabricating special capacitor electrodes, each electrode of the capacitor devices may be implemented through a metal layer, a semiconductor layer (e.g., doped polysilicon), etc., and the first capacitor C1, the second capacitor C2, the third capacitor C3, and the fourth capacitor C4 may also be parasitic capacitances between transistors, and may be implemented through transistors themselves and other devices and circuits. For example, the first capacitor C1 can maintain the level of the second node H, and can achieve the bootstrap function when the high level of the first clock signal is transmitted to the third node N. The second capacitor C2, the third capacitor C3, and the fourth capacitor C4 can all maintain the level of the first node Q. When the first scanning signal output terminal OT1 outputs a signal, the second capacitor C2 can achieve the bootstrap effect, when the second scanning signal output terminal OT2 outputs a signal, the third capacitor C3 can achieve the bootstrap effect, and when the shift signal output terminal CR outputs a signal, the fourth capacitor C4 can achieve the bootstrap effect.

For example, as shown in FIGS. 4A and 4B, the noise reduction circuit 500 includes a fourth transistor M4, a fifth transistor M5, a sixth transistor M6, and a seventh transistor M7.

For example, a gate electrode of the fourth transistor M4 is connected to the fourth node QB, a first electrode of the fourth transistor M4 is connected to the first node Q, and a second electrode of the fourth transistor M4 is connected to the first voltage terminal VGL1 to receive the first voltage.

For example, a gate electrode of the fifth transistor M5 is connected to the fourth node QB, a first electrode of the fifth transistor M5 is connected to the shift signal output terminal CR, and a second electrode of the fifth transistor M5 is connected to the first voltage terminal VGL1 to receive the first voltage.

For example, a gate electrode of the sixth transistor M6 is connected to the fourth node QB, a first electrode of the sixth transistor M6 is connected to the first scanning signal output terminal OT1, and a second electrode of the sixth transistor M6 is connected to a second voltage terminal VGL2 to receive a second voltage.

For example, a gate electrode of the seventh transistor M7 is connected to the fourth node QB, a first electrode of the seventh transistor M7 is connected to the second scanning signal output terminal OT2, and a second electrode of the seventh transistor M7 is connected to the second voltage terminal VGL2 to receive the second voltage.

For example, the second voltage terminal VGL2 is configured to provide the second voltage, and the second voltage is a DC low-level signal (e.g., lower than or equal to the low level of the clock signal). For example, the second voltage terminal VGL2 may be grounded. The following embodiments are the same as the above case and similar portions will not be described again. For example, in an example, the second voltage provided by the second voltage terminal VGL2 is higher than the first voltage provided by the first voltage terminal VGL1, for example, the first voltage is −10V and the second voltage is −6v; and in another example, the second voltage of the second voltage terminal VGL2 is equal to the first voltage of the first voltage terminal VGL1, so that the shift register unit 10 can connect both the second electrode of the sixth transistor M6 and the second electrode of the seventh transistor M7 to the first voltage terminal VGL1 without setting the second voltage terminal VGL2. The first voltage and the second voltage may be the same or different, which may depend on actual requirements. The embodiments of the present disclosure are not limited thereto.

It should be noted that in a case where the output circuit 300 is not provided with the third output transistor M20, accordingly, the noise reduction circuit 500 may not be provided with the seventh transistor M7.

For example, in a case where the fourth node QB is at an effective level (e.g., high level), the fourth transistor M4, the fifth transistor M5, the sixth transistor M6, and the seventh transistor M7 are all turned on, and both the first node Q and the shift signal output terminal CR are connected to the first voltage terminal VGL1, thereby pulling down the potential of the first node Q and the potential of the shift signal output terminal CR to a low potential through the first voltage terminal VGL1. The first scanning signal output terminal OT1 and the second scanning signal output terminal OT2 are both connected to the second voltage terminal VGL2, so that the potentials of the first scanning signal output terminal OT1 and the second scanning signal output terminal OT2 are pulled down to a low potential through the second voltage terminal VGL2, thereby reducing the noises of the first node Q, the shift signal output terminal CR, the first scanning signal output terminal OT1, and the second scanning signal output terminal OT2. It should be noted that in various embodiments of the present disclosure, in a case where the output terminal OP includes a plurality of first scanning signal output terminals and/or a plurality of shift signal output terminals, the noise reduction circuit 500 correspondingly includes a plurality of transistors connected to the plurality of shift signal output terminals and/or the plurality of first scanning signal output terminals in a one-to-one correspondence manner, in order to performing noise reduction on the plurality of shift signal output terminals and/or the plurality of first scanning signal output terminals.

For example, as shown in FIG. 4A, in some embodiments, the first control circuit 600 includes an eighth transistor M8 and a ninth transistor M9.

For example, a gate electrode of the eighth transistor M8 is connected to a first electrode of the eighth transistor M8, and is configured to connect a third voltage terminal VDD_A to receive a third voltage, and a second electrode of the eighth transistor M8 is connected to the fourth node QB. A gate electrode of the ninth transistor M9 is connected to the first node Q, a first electrode of the ninth transistor M9 is connected to the fourth node QB, and a second electrode of the ninth transistor M9 is connected to the first voltage terminal VGL1 to receive the first voltage.

For example, as shown in FIG. 4B, in other embodiments, the first control circuit 600 further includes a seventeenth transistor M17. A gate electrode of the seventeenth transistor M17 is connected to a first electrode of the seventeenth transistor M17, and is configured to be connected to a fifth voltage terminal VDD_B to receive a fifth voltage, and a second electrode of the seventeenth transistor M17 is connected to the fourth node QB.

For example, in an example, the third voltage terminal VDD_A is configured to provide a DC low-level signal and the fifth voltage terminal VDD_B is configured to provide a DC high-level signal, so that the eighth transistor M8 is always turned off and the seventeenth transistor M17 is always turned on. For example, in another example, the third voltage terminal VDD_A and the fifth voltage terminal VDD_B are configured to alternately provide a DC high-level signal, so that the eighth transistor M8 and the seventeenth transistor M17 are alternately turned on to avoid performance drift caused by the transistors being turned on for long time. For example, in a case where the third voltage terminal VDD_A provides a high-level signal, the fifth voltage terminal VDD_B provides a low-level signal. At this time, the eighth transistor M8 is turned on and the seventeenth transistor M17 is turned off. In a case where the fifth voltage terminal VDD_B provides a high-level signal, the third voltage terminal VDD_A provides a low-level signal. At this time, the seventeenth transistor M17 is turned on and the eighth transistor M8 is turned off.

For example, in a case where the first node Q is at an effective level (e.g., high level), the ninth transistor M9 is turned on. By designing a proportional relationship between a channel width-to-length ratio of the ninth transistor M9 and a channel width-to-length ratio of the turn-on eighth transistor M8 or a channel width-to-length ratio of the turn-on seventeenth transistor M17, for example, the channel width-to-length ratio of the ninth transistor M9 is larger than any one of the channel width-to-length ratio of the eighth transistor M8 and the channel width-to-length ratio of the seventeenth transistor M17, and therefore, the potential of the fourth node QB can be pulled down to a low level. In a case where the first node Q is at a low level, the ninth transistor M9 is turned off. If the eighth transistor M8 is turned on and the seventeenth transistor M17 is turned off, the third voltage (high level) provided by the third voltage terminal VDD_A is written into the fourth node QB via the eighth transistor M8 to pull up the potential of the fourth node QB to a high level. If the eighth transistor M8 is turned off and the seventeenth transistor M17 is turned on, the fifth voltage (high level) provided by the fifth voltage terminal VDD_B is written into the fourth node QB via the seventeenth transistor M17 to pull up the potential of the fourth node QB to the high level.

For example, as shown in FIGS. 4A and 4B, the first reset circuit 700 includes a tenth transistor M10. A gate electrode of the tenth transistor M10 is connected to the first reset control signal terminal Re1 to receive the first reset control signal, a first electrode of the tenth transistor M10 is connected to the first node Q, and a second electrode of the tenth transistor M10 is connected to the first voltage terminal VGL1 to receive the first voltage. For example, in the display period of one frame, in a case where the first reset signal is at an effective level (e.g., high level), the tenth transistor M10 is turned on, the first node Q is connected to the first voltage terminal VGL1, and the first voltage provided by the first voltage terminal VGL1 is written to the first node Q, thereby achieving to reset the first node Q.

For example, in an example, in the case where a plurality of shift register units 10 are cascaded, the shift signal output terminal CR of the $(n_2+3)$-th stage shift register unit 10 is connected to a first reset control signal terminal Re1 of the $(n_2)$-th stage shift register unit 10, thereby taking the output signal of the shift signal output terminal CR of the $(n_2+3)$-th stage shift register unit 10 as the first reset control signal of the $(n_2)$-th stage shift register unit 10. Here, $n_2$ is an integer greater than zero. Of course, the embodiments of the present disclosure are not limited to this case, and the first reset control signal terminal Re1 may also be connected to a separately provided signal line.

For example, as shown in FIGS. 4A and 4B, the second reset circuit 800 includes an eleventh transistor M11. A gate electrode of the eleventh transistor M11 is connected to the second reset control signal terminal Re2 to receive the second reset control signal, a first electrode of the eleventh transistor M11 is connected to the first node Q, and a second electrode of the eleventh transistor M11 is connected to the first voltage terminal VGL1 to receive the first voltage. For example, in the blanking period of one frame, in a case where the second reset signal is at an effective level (e.g., high level), the eleventh transistor M11 is turned on, the first node Q is connected to the first voltage terminal VGL1, and the first voltage provided by the first voltage terminal VGL1 is written to the first node Q, thereby achieving to reset the first node Q.

For example, as shown in FIGS. 4A and 4B, the second control circuit 610 includes a twelfth transistor M12 and a thirteenth transistor M13. The third control signal includes the first clock signal and the voltage of the second node H.

For example, a gate electrode of the twelfth transistor M12 is configured to be connected to the first clock signal terminal CLKA to receive the first clock signal, a first electrode of the twelfth transistor M12 is configured to be connected to the fourth node QB, a second electrode of the twelfth transistor M12 is connected to a first electrode of the thirteenth transistor M13, a gate electrode of the thirteenth transistor M13 is connected to the second node H, and a second electrode of the thirteenth transistor M13 is connected to the first voltage terminal VGL1 to receive the first voltage.

For example, in the blanking period of one frame, when both the level of the first clock signal and the level of the second node H are an effective level (e.g., high level), the twelfth transistor M12 and the thirteenth transistor M13 are turned on, the fourth node QB is connected to the first voltage terminal VGL1, the first voltage provided by the first voltage terminal VGL1 is written to the fourth node QB, and therefore, the fourth node QB is pulled down to a low level.

It should be noted that in some embodiments, the second control circuit 610 may include only the twelfth transistor M12, the third control signal may include only the first clock signal, the gate electrode of the twelfth transistor M12 is connected to the first clock signal terminal CLKA to receive the first clock signal, the first electrode of the twelfth transistor M12 is connected to the fourth node QB, and the second electrode of the twelfth transistor M12 is connected to the first voltage terminal VGL1 to receive the first voltage.

For example, as shown in FIGS. 4A and 4B, the third control circuit 620 includes a fourteenth transistor M14. A gate electrode of the fourteenth transistor M14 is connected to the fourth control signal terminal Con2 to receive the fourth control signal, a first electrode of the fourteenth transistor M14 is connected to the fourth node QB, and a second electrode of the fourteenth transistor M14 is connected to the first voltage terminal VGL1 to receive the first voltage. For example, in the display period of one frame, in a case where the fourth control signal is at an effective level (e.g., high level), the fourteenth transistor M14 is turned on, the fourth node QB is connected to the first voltage terminal VGL1, the first voltage provided by the first voltage terminal VGL1 is written to the fourth node QB, and therefore, the fourth node QB is pulled down to a low level.

For example, in an example, in the case where a plurality of shift register units 10 are cascaded, a shift signal output terminal CR of a (m2)-th stage shift register unit 10 is connected to a fourth control signal terminal Con2 of the (m2+3)-th stage shift register unit 10, thereby taking an output signal of the shift signal output terminal CR of the (m2)-th stage shift register unit 10 as a fourth control signal of the (m2+3)-th stage shift register unit 10. Here, m2 is an integer greater than zero. Of course, the embodiments of the present disclosure are not limited to this case, and the fourth control signal terminal Con2 may be connected to a separately provided signal line.

It should be noted that those skilled in the art can understand that in the embodiments of the present disclosure, the specific implementation modes of the first input circuit 100, the second input circuit 200, the output circuit 300, the compensation circuit 400, the noise reduction circuit 500, the first control circuit 600, the second control circuit 610, the third control circuit 620, the first reset circuit 700, the second reset circuit 800, etc. are not limited to the above-described modes, but can be any suitable implementation mode, such as a conventional connection mode well known to those skilled in the art, as long as the corresponding functions need to be ensured to be implemented. The above examples do not limit the scope of protection of the present disclosure. In practical application, a skilled person may choose to use or not to use one or more of the above circuits according to the situation. Various combinations and variations of the above circuits based on the principle of the present disclosure do not deviate from the present disclosure, and will not be described again. For example, those skilled in the art can understand that the shift register unit provided according to the embodiment of the present disclosure may have an anti-leakage function, for example, one or more transistors in the shift register unit 10 may be selected according to actual conditions to add an anti-leakage circuit structure. In addition, in the description of the various embodiments of the present disclosure, the first node Q, the second node H, the third node N, the fourth node QB, etc. do not represent actual components, but represent junction points of related connections in the circuit diagram.

The transistors used in the embodiments of the present disclosure may be thin film transistors, field effect transistors, or other switching devices with the same characteristics, and the embodiments of the present disclosure are described by taking a case that all transistors are the thin film transistors as an example. In addition, the transistors in the embodiments of the present disclosure are all described by taking N-type transistors as examples, in this case, a first electrode of a transistor is a drain electrode and a second electrode of the transistor is a source electrode. It should be noted that the present disclosure includes but is not limited to this case. For example, one or more transistors in the shift register unit 10 provided by the embodiment of the present disclosure may also adopt P-type transistors. In this case, a first electrode of a transistor is a source electrode and a second electrode of the transistor is a drain electrode. As long as respective electrodes of a selected-type transistor are correspondingly connected in accordance with respective electrodes of a corresponding transistor in the embodiment of the present disclosure, and respective voltage terminals provide the corresponding high voltage or low voltage. In the case where an N-type transistor is used, Indium Gallium Zinc Oxide (IGZO) can be used as an active layer of the thin film transistor, which may effectively reduce the size of the transistor and prevent leakage current compared with using Low Temperature Poly Silicon (LTPS) or amorphous silicon (such as hydrogenated amorphous silicon) as the active layer of the thin film transistor.

Figure 5:
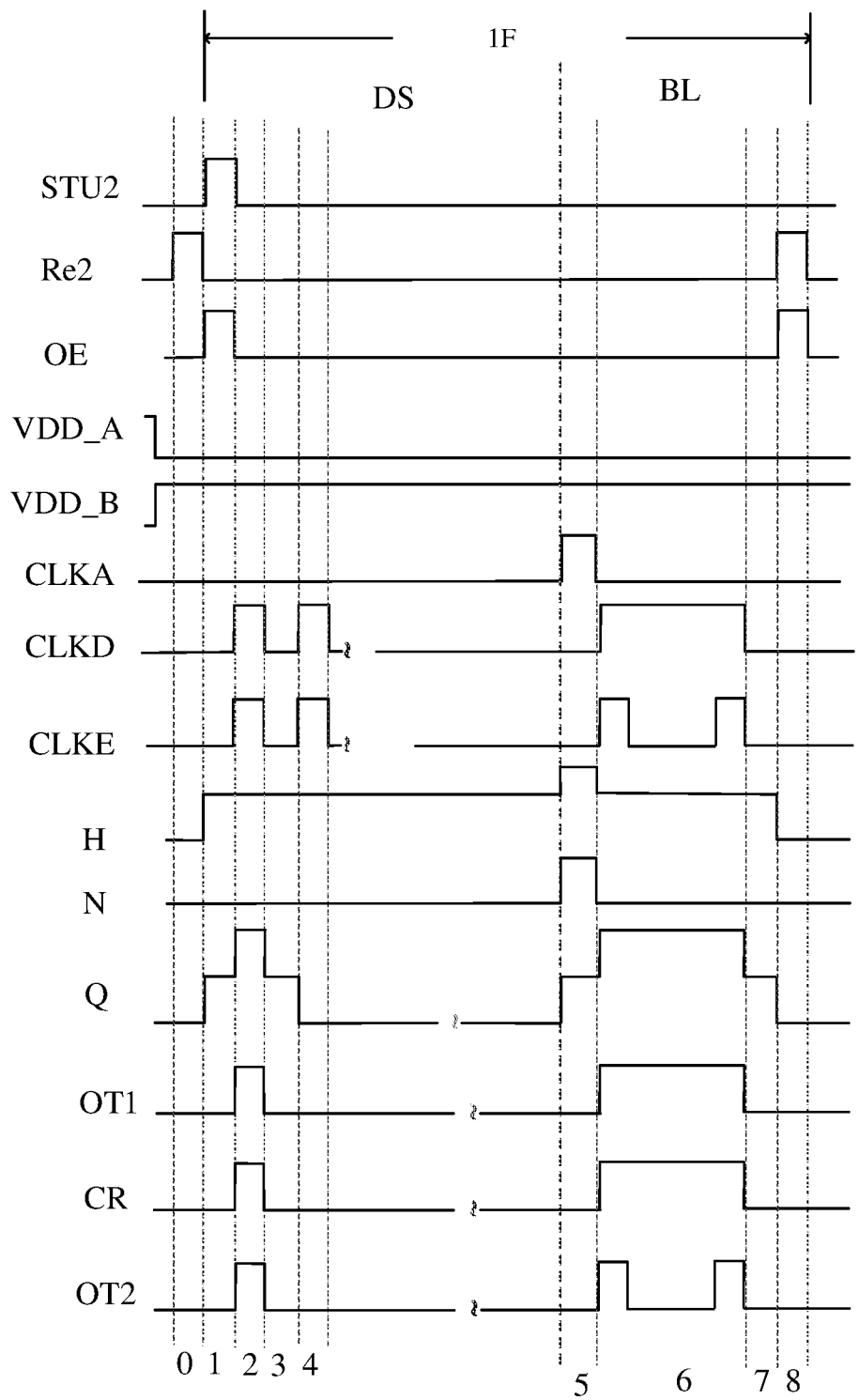
FIG. 5 is a signal timing diagram of a shift register unit provided by some embodiments of the present disclosure.

FIG. 5 is a signal timing diagram of a shift register unit provided by some embodiments of the present disclosure. The operation principle of the shift register unit 10 as shown in FIG. 4B will be described below with reference to the signal timing chart as shown in FIG. 5, and is described by taking a case that each transistor is an N-type transistor as an example herein, but the embodiments of the present disclosure are not limited thereto.

In FIG. 5 and the following description, 1F and 2F represent the timing of the first frame, the timing of the second frame, the timing of the third frame, and the timing of the fourth frame, respectively. DS represents a display period of one frame, BL represents a blanking period of one frame. STU1, STU2, Con1, Con2, VDD_A, VDD_B, CLKA, CLKD, CLKE, OT1, OT2, CR, etc. are not only used to represent corresponding signal terminals, but also used to represent corresponding signals. The following embodiments are the same as those described herein, and the repeated descriptions will not be described again.

For example, as shown in FIGS. 4B and 5, in an initial phase 0, the second reset signal Re2 is at a high level, the eleventh transistor M11 is turned on, and the first voltage of the first voltage terminal VGL1 is written to the first node Q via the eleventh transistor M11 to reset the first node Q. The third voltage VDD_A is a low-high signal, and the fifth voltage VDD_B is a high-level signal, and therefore, the eighth transistor M8 is turned off, the seventeenth transistor M17 is turned on, the fifth voltage VDD_B is written into the fourth node QB via the seventeenth transistor M17, and the potential of the fourth node QB is pulled up to a high level, and therefore, the fourth transistor M4 is turned on, thereby performing auxiliary pull-down on the first node Q, so as to make the potential of the first node Q be at a low level. Because the level of the fourth node QB is a high level, the second compensation transistor M16 is also turned on, and therefore, the third node N is also reset. In addition, because the potential of the fourth node QB is at a high level, the fifth transistor M5, the sixth transistor M6, and the seventh transistor M7 are all turned on, thereby performing noise reduction on the shift signal output terminal CR, the first scanning signal output terminal OT1, and the second scanning signal output terminal OT2, so that the potential of the shift signal output terminal CR, the potential of the first scanning signal output terminal OT1, and the potential of the second scanning signal output terminal OT2 are at a low level.

For example, in the display period DS, in a first phase 1, the first control signal terminal STU2 is at a high level, the third transistor M3 is turned on, and the first input signal (e.g., the fourth voltage having a high level provided by the fourth voltage terminal VDD) is written into the first node Q via the third transistor M3 and stored by the fourth capacitor C4. The detection control signal OE is at a high level, so that the first transistor M1 is turned on, and a second input signal (e.g., a high level signal) is written to the second node H via the first transistor M1 and stored by the first capacitor C1. In this case, the level of the second node H is at a high level. It should be noted that the first capacitor C1 can store the second input signal having a high level and hold the high level until the end of the display period of one frame for use in the blanking period. The first clock signal CLKA is a low-level signal, and the second transistor M2 is turned off.

Because the first node Q is at a high level, the first output transistor M18, the second output transistor M19, and the third output transistor M20 are all turned on, the first output clock signal CLKD is output to the shift signal output terminal CR and the first scanning signal output terminal OT1, respectively, via the first output transistor M18 and the second output transistor M19, and the second output clock signal CLKE is output to the second scanning signal output terminal OT2 via the third output transistor M20. However, because both the first output clock signal CLKD and the second output clock signal CLKE are low-level signals, that is, the shift signal output terminal CR, the first scanning signal output terminal OT1, and the second scanning signal output terminal OT2 output low-level signals. In addition, because the first node Q is at a high level, the ninth transistor M9 is turned on, thereby pulling down the potential of the fourth node QB to a low level.

For example, as shown in FIGS. 4B and 5, in a second phase 2, the first node Q is kept at a high level, the first output transistor M18, the second output transistor M19, and the third output transistor M20 are kept to be turned on, and both the first output clock signal CLKD and the second output clock signal CLKE become to be at a high level, and therefore, the shift signal output terminal CR, the first scanning signal output terminal OT1, and the second scanning signal output terminal OT2 output high-level signals. Due to the bootstrap effect of the second capacitor C2, the third capacitor C3, and the fourth capacitor C4, the potential of the first node Q is further pulled up, and the first output transistor M18, the second output transistor M19, and the third output transistor M20 are more fully turned on. For example, the high-level signal output from the shift signal output terminal CR can be used for scanning shift of the upper and lower shift register units, and the high-level signal output from the first scanning signal output terminal OT1 and the high-level signal output from the second scanning signal output terminal OT2 can be used to drive pixel units in the display panel for display.

For example, as shown in FIGS. 4B and 5, in a third phase 3, the first output clock signal CLKD and the second output clock signal CLKE become to be at a low level, and both the shift signal output terminal CR and the first scanning signal output terminal OT1 can be discharged through the first output clock signal terminal CLKD, thereby completing the reset of the shift signal output terminal CR and the first scanning signal output terminal OT1. The second scanning signal output terminal OT2 is discharged through the second output clock signal terminal CLKE, thus completing the reset of the second scanning signal output terminal OT2. In this case, the shift signal output terminal CR, the first scanning signal output terminal OT1, and the second scanning signal output terminal OT2 output low-level signals. Due to the bootstrap effect of the second capacitor C2, the third capacitor C3, and the fourth capacitor C4, the potential of the first node Q is lowered but still kept to be at a high level. The first output transistor M18, the second output transistor M19, and the third output transistor M20 are still kept to be turned on. The low level of the first output clock signal terminal CLKD is output to the shift signal output terminal CR and the first scanning signal output terminal OT1, and the low level of the second output clock signal terminal CLKE is output to the second scanning signal output terminal OT2, thereby achieving to reset the output terminal OP.

For example, as shown in FIGS. 4B and 5, in a fourth phase 4, the first reset signal Re1 (not shown) is a high-level signal, and the tenth transistor M10 is turned on, so that the first voltage of the first voltage terminal VGL1 is written to the first node Q to reset the first node Q. The level of the first node Q becomes a low level, so that the ninth transistor M9 is turned off, the third voltage VDD_A is a high-level signal, and the fifth voltage VDD_B is a low-level signal, so that the eighth transistor M8 is turned off, and the seventeenth transistor M17 is turned on, so that the fifth voltage VDD_B is written into the fourth node QB via the seventeenth transistor M17, and the fourth node QB is pulled up to a high level, so that the fourth transistor M4 is turned on, to further perform noise reduction on the first node Q. The fifth transistor M5, the sixth transistor M6, and the seventh transistor M7 are also turned on under the control of the high level of the fourth node QB, thereby performing noise reduction on the shift signal output terminal CR, the first scanning signal output terminal OT1, and the second scanning signal output terminal OT2.

For example, in the first phase 1 to the third phase 3 mentioned above, because the fourth node QB is always at a low level, the second compensation transistor M16 is turned off. However, in the fourth phase 4, because the fourth node QB is pulled up to a high level, the second compensation transistor M16 is turned on, thereby performing noise reduction on the third node N, so that the level of the third node N is a low level.

For example, in the first phase 1 to the fourth phase 4 mentioned above, because the first clock signal CLKA is always kept at a low level, the second transistor M2 is in a turn-off state, thereby isolating the second node H and the first node Q to prevent the level of the second node H from affecting the output signal in the display period. As shown in FIG. 5, the level of the first node Q is in a tower-shaped waveform, the pull-up and reset of the output signal of the shift signal output terminal CR are achieved by the first output transistor M18, the pull-up and reset of the output signal of the first scanning signal output terminal OT1 are achieved by the second output transistor M19, and the pull-up and reset of the output signal of the second scanning signal output terminal OT2 are achieved by the third output transistor M20. The fifth transistor M5 plays an auxiliary pull-down role on the output signal of the shift signal output terminal CR, the sixth transistor M6 plays an auxiliary pull-down role on the output signal of the first scanning signal output terminal OT1, and the seventh transistor M7 plays an auxiliary pull-down role on the output signal of the second scanning signal output terminal OT2. Therefore, the volume of the fifth transistor M5, the volume of the sixth transistor M6, and the volume of the seventh transistor M7 can be reduced, which is advantageous for reducing an area of the circuit layout.

For example, as shown in FIGS. 4B and 5, in the blanking period BL, in a fifth phase 5, the second node H is still kept at a high level due to a holding effect of the first capacitor C1, the first compensation transistor M15 is turned on, the first clock signal CLKA is a high-level signal, and the first clock signal CLKA can charge the third node N, so that the level of the third node N becomes a high level. Due to the bootstrap effect of the first capacitor C1, the potential of the second node H is further pulled up, thus achieving the compensation operation for the second node H. In this case, the first compensation transistor M15 is more fully turned on, so that the level of the third node N can reach the high level of the first clock signal CLKA. Meanwhile, because the first clock signal CLKA is a high-level signal, the second transistor M2 is turned on, and the level of the second node H is transmitted to the first node Q to pull the first node Q up to a high potential. The ninth transistor M9 is turned on under the control of the first node Q, and the fourth node QB is pulled down to a low level. Because the level of the first node Q is a high level, the first output transistor M18, the second output transistor M19, and the third output transistor M20 are turned on, the first output clock signal CLKD is output to the shift signal output terminal CR and the first scanning signal output terminal OT1, respectively, via the first output transistor M18 and the second output transistor M19, and the second output clock signal CLKE is output to the second scanning signal output terminal OT2 via the third output transistor M20. However, because both the first output clock signal CLKD and the second output clock signal CLKE are low-level signals, that is, the shift signal output terminal CR, the first scanning signal output terminal OT1, and the second scanning signal output terminal OT2 output low-level signals.

For example, as shown in FIGS. 4B and 5, in a sixth phase 6, the first clock signal CLKA becomes to be at a low level and the second transistor M2 is turned off, so that the first node Q does not leak through the second transistor M2. The first node Q is kept to be at a high level, the first output transistor M18, the second output transistor M19 and the third output transistor M20 are kept to be turned on, and the first output clock signal CLKD becomes to be at a high level, and therefore, both the shift signal output terminal CR and the first scanning signal output terminal OT1 output high-level signals. Due to the bootstrap effect of the second capacitor C2, the third capacitor C3, and the fourth capacitor C4, the potential of the first node Q is further pulled up, and the first output transistor M18, the second output transistor M19, and the third output transistor M20 are more fully turned on. For example, the signal output from the first scanning signal output terminal OT1 can be used to drive the sensing transistors in the pixel units in the display panel to achieve external compensation. Because the second output clock signal CLKE outputs a pulse signal, the second scanning signal output terminal OT2 also outputs a pulse signal. It should be noted that in the sixth phase 6, the signal output from the second scanning signal output terminal OT2 can be designed according to the actual application, and the present disclosure is not limited to this case.

For example, in the sixth phase 6, the first clock signal CLKA becomes to be at a low level, so that the level of the third node N becomes a low level. Due to the bootstrap effect of the first capacitor C1, the potential of the second node H is lowered but still kept to be at a high level.

For example, as shown in FIGS. 4B and 5, in a seventh phase 7, the first output clock signal CLKD and the second output clock signal CLKE become to be at a low level, and both the shift signal output terminal CR and the first scanning signal output terminal OT1 can be discharged through the first output clock signal terminal CLKD, thereby achieving to reset the shift signal output terminal CR and the first scanning signal output terminal OT1. The second scanning signal output terminal OT2 is discharged through the second output clock signal terminal CLKE, thus achieving to reset the second scanning signal output terminal OT2. In this case, the shift signal output terminal CR, the first scanning signal output terminal OT1, and the second scanning signal output terminal OT2 output low-level signals. Due to the bootstrap effect of the second capacitor C2, the third capacitor C3, and the fourth capacitor C4, the potential of the first node Q is lowered but still kept to be at a high level. The first output transistor M18, the second output transistor M19, and the third output transistor M20 are still kept to be turned on. The low level of the first output clock signal terminal CLKD is output to the shift signal output terminal CR and the first scanning signal output terminal OT1, and the low level of the second output clock signal terminal CLKE is output to the second scanning signal output terminal OT2, thereby achieving to reset the output terminal OP.

For example, as shown in FIGS. 4B and 5, in an eighth phase 8, the second reset signal Re2 is at a high level, the eleventh transistor M11 is turned on, and the first voltage of the first voltage terminal VGL1 is written to the first node Q via the eleventh transistor M11 to reset the first node Q. The detection control signal OE is at a high level, and the first transistor M1 is also turned on. In this case, the second input signal BP is at a low level, and the second input signal BP is written to the second node H via the first transistor M1, so that the second node H is also reset. In this way, the second node H can be kept at a high level for a short period, so as to reduce the risk of threshold voltage drift (e.g., positive drift) of the transistor connected to the second node H, which helps to improve the reliability of the circuit.

It should be noted that in the above description of the operation processes of the display period DS and the blanking period BL, by taking a case that the shift register unit includes two scanning signal output terminals (i.e., the first scanning signal output terminal OT1 and the second scanning signal output terminal OT2) as an example, but the present disclosure is not limited thereto, and the shift register unit may include only one scanning signal output terminal (e.g., the first scanning signal output terminal OT1). In a case where the shift register unit can include only the first scanning signal output terminal OT1, the operation process of the shift register unit is similar to the above-mentioned operation process, so long as the relevant description about the second scanning signal output terminal OT2 is omitted, and the repetition will not be repeated here.

It should be noted that in the embodiments of the present disclosure, for example, in a case where each circuit is implemented as N-type transistor(s), the term "pull-up" means charging a node or an electrode of a transistor so as to raise an absolute value of a level of the node or a level of the electrode, thereby implementing an operation (e.g., turn-on) of a corresponding transistor; the term "pull-down" means discharging a node or an electrode of a transistor, so that an absolute value of a level of the node or the electrode is decreased, thereby implementing an operation (e.g., turn-off) of the corresponding transistor. The term "operation potential" represents that a node is at a high potential, so that in a case where a gate electrode of a transistor is connected to the node, the transistor is turned on; the term "non-operation potential" represents that a node is at a low potential, so that in a case where a gate electrode of a transistor is connected to the node, the transistor is turned off. For another example, in a case where each circuit is implemented as P-type transistor(s), the term "pull-up" means discharging a node or an electrode of a transistor, so that an absolute value of a level of the node or the electrode is decreased, thereby achieving an operation (e.g., turn-on)

of a corresponding transistor; and the term "pull-down" means charging a node or an electrode of a transistor, so that an absolute value of a level of the node or the electrode is increased, thereby achieving an operation (e.g., turn-off) of a corresponding transistor. The term "operation potential" represents that a node is at a low potential, so that in a case where a gate electrode of a transistor is connected to the node, the transistor is turned on; and the term "non-operation potential" represents that a node is at a high potential, so that in a case where a gate electrode of a transistor is connected to the node, the transistor is turned off.

Figure 6:
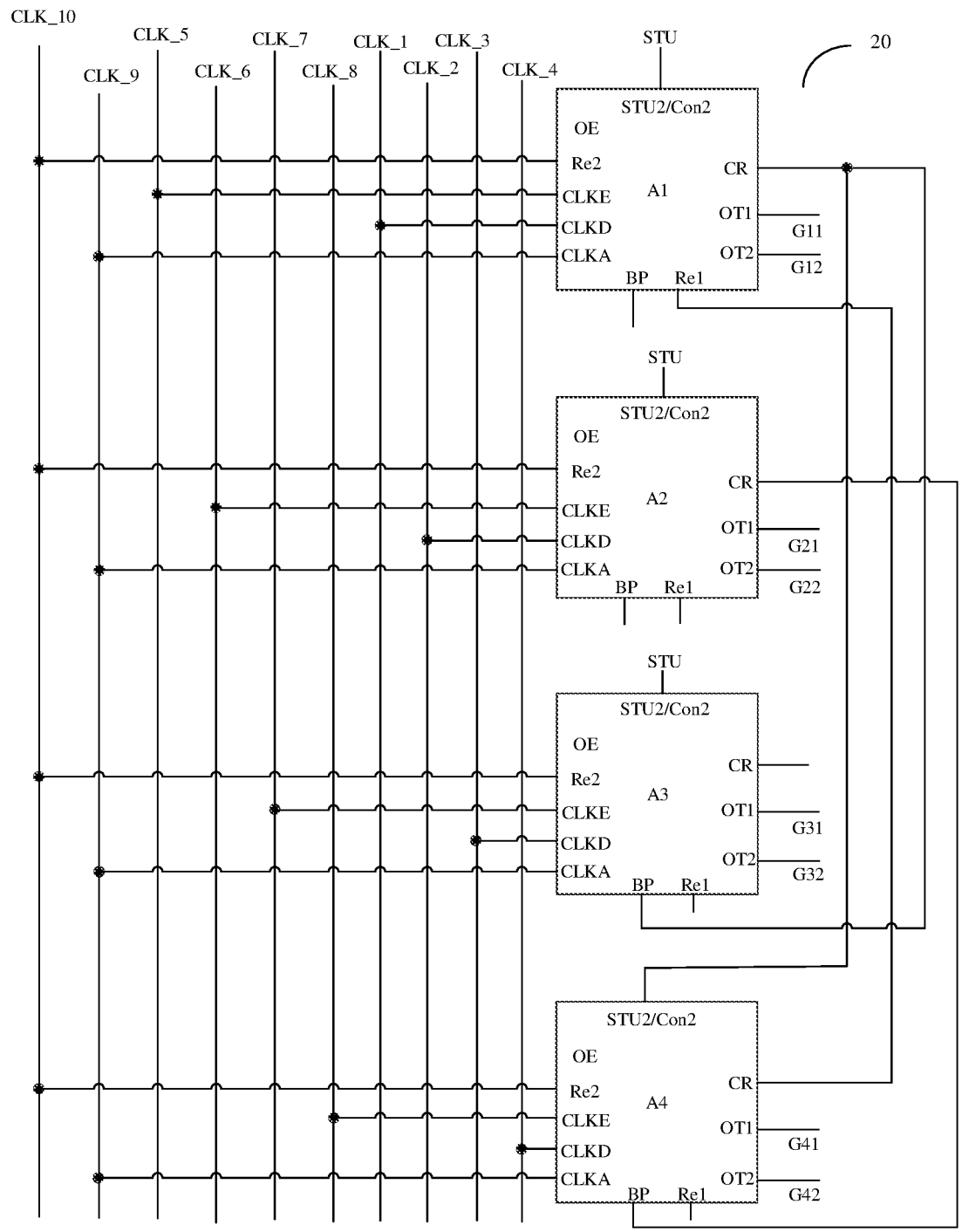
FIG. 6 is a schematic block diagram of a gate driving circuit provided by some embodiments of the present disclosure.

FIG. 6 is a schematic block diagram of a gate driving circuit provided by some embodiments of the present disclosure.

At least some embodiments of the present disclosure also provide a gate driving circuit. For example, as shown in FIG. 6, the gate driving circuit 20 includes a plurality of shift register units (e.g., A1, A2, A3, A4, etc.). A plurality of shift register units are cascaded. The number of the plurality of shift register units is not limited and can be determined according to actual requirements. For example, the shift register unit may adopt the shift register unit 10 described in any one of embodiments of the present disclosure.

The gate driving circuit has a simple circuit structure and can compensate the threshold voltage loss of the level written to the first node during the blanking period, thereby preventing the output signal from being affected due to the threshold voltage loss of the transistor and enhancing the reliability of the circuit. At the same time, the shift register unit can achieve random compensation, avoid brightness deviation of scanning lines and panels caused by row-by-row sequential compensation, improve display uniformity, and improve display effect.

For example, the gate driving circuit 20 can be directly integrated on the array substrate of the display device using a manufacturing process similar to that of the thin film transistor to achieve the progressive scan drive function. The first scanning signal output terminals OT1 of these shift register units are respectively connected to a plurality of first gate lines (e.g., G11, G21, G31, G41, etc.) in one-to-one correspondence manner. The second scanning signal output terminals OT2 of these shift register units are respectively connected to a plurality of second gate lines (e.g., G12, G22, G32, G42, etc.) in one-to-one correspondence manner.

For example, each shift register unit includes a first control signal terminal STU2, a first clock signal terminal CLKA (the first clock signal terminal CLKA is also the second control signal terminal STU1), a detection control signal terminal OE, a first output clock signal terminal CLKD, a second output clock signal terminal CLKE, a first reset signal terminal Re1, a second reset signal terminal Re2, a fourth control signal terminal Con2, a shift signal output terminal CR, a first scanning signal output terminal OT1, a second scanning signal output terminal OT2, and the like.

For example, as shown in FIG. 6, the gate driving circuit 20 further includes a first clock signal line CLK_1, a second clock signal line CLK_2, a third clock signal line CLK_3, and a fourth clock signal line CLK_4. The connection mode in which respective shift register units are connected to the above respective clock signal lines is as follows and so on.

For example, in the case where the shift register unit includes a first output clock signal terminal, as shown in FIG. 6, a first output clock signal terminal CLKD of a $(4n_1-3)$-th stage shift register unit (e.g., a first stage shift register unit A1) of the plurality of shift register units is connected to the first clock signal line CLK_1; a first output clock signal terminal CLKD of a $(4n_1-2)$-th stage shift register unit (for example, a second stage shift register unit A2) of the plurality of shift register units is connected to the second clock signal line CLK_2; a first output clock signal terminal CLKD of a $(4n_1-1)$-th stage shift register unit (e.g., a third stage shift register unit A3) of the plurality of shift register units is connected to the third clock signal line CLK_3; a first output clock signal terminal CLKD of a $(4n_1)$-th stage shift register unit (for example, a fourth stage shift register unit A4) of the plurality of shift register units is connected to the fourth clock signal line CLK_4; $n_1$ is an integer greater than zero.

For example, as shown in FIG. 6, the gate driving circuit 20 further includes a fifth clock signal line CLK_5, a sixth clock signal line CLK_6, a seventh clock signal line CLK_7, and an eighth clock signal line CLK_8. The connection mode in which respective shift register units are connected to the above respective clock signal lines is as follows and so on.

For example, as shown in FIG. 6, in the case where the shift register unit includes a second output clock signal terminal, a second output clock signal terminal CLKE of the $(4n_1-3)$-th stage shift register unit (e.g., the first stage shift register unit A1) is connected to the fifth clock signal line CLK_5; a second output clock signal terminal CLKE of the $(4n_1-2)$-th stage shift register unit (for example, the second stage shift register unit A2) is connected to the sixth clock signal line CLK_6; a second output clock signal terminal CLKE of the $(4n_1-1)$-th stage shift register unit (for example, the third stage shift register unit A3) is connected to the seventh clock signal line CLK_7; and a second output clock signal terminal CLKE of the $(4n_1)$-th stage shift register unit (for example, the fourth stage shift register unit A4) is connected to the eighth clock signal line CLK_8.

For example, as shown in FIG. 6, the gate driving circuit 20 further includes a ninth clock signal line CLK_9 and a tenth clock signal line CLK_10. The ninth clock signal line CLK_9 is configured to be connected to first clock signal terminals CLKA (i.e., the second control signal terminals STU1) of respective shift register units (e.g., the first stage shift register unit A1, the second stage shift register unit A2, the third stage shift register unit A3, and the fourth stage shift register unit A4). The tenth clock signal line CLK_10 is configured to be connected to second reset control signal terminals Re2 of the respective shift register units (for example, the first stage shift register unit A1, the second stage shift register unit A2, the third stage shift register unit A3, and the fourth stage shift register unit A4).

For example, in the case where the shift register unit includes a shift signal output terminal and the first control signal terminal STU2, as shown in FIG. 6, in some embodiments, a first control signal terminal STU2 and a fourth control signal terminal Con2 of the first stage shift register unit A1, a first control signal terminal STU2 and a fourth control signal terminal Con2 of the second stage shift register unit A2, and a first control signal terminal STU2 and a fourth control signal terminal Con2 of the third stage shift register unit A3 are connected to a control signal line STU, for example, to receive a trigger signal STY. In addition to the first stage shift register unit A1, the second stage shift register unit A2, and the third stage shift register unit A3, a first control signal terminal STU2 and a fourth control signal terminal Con2 of an $(n_2+3)$-th stage shift register unit (e.g., the fourth stage shift register unit A4) of the plurality of shift register units are connected to a shift signal output terminal CR of an $(n_2)$-th stage shift register unit (e.g., the first stage shift register unit A1) of the plurality of shift register units, and $n_2$ is an integer greater than zero.

For example, as shown in FIG. 6, in some embodiments, both a second input signal terminal BP of the first stage shift register unit A1 and a second input signal terminal BP of the second stage shift register unit A2 are connected to an input signal line. In addition to the first stage shift register unit A1 and the second stage shift register unit A2, a second input signal terminal BP of an ($n_2$+2)-th stage shift register unit (e.g., the third stage shift register unit A2) of the plurality of shift register units is connected to a shift signal output terminal CR of the ($n_2$)-th stage shift register unit (e.g., the first stage shift register unit A1), i.e., a signal output from the shift signal output terminal CR of the ($n_2$)-th stage shift register unit serves as a second input signal BP of the ($n_2$+2)-th stage shift register unit.

For example, in the case where the shift register unit includes the first reset control signal terminal Re1, as shown in FIG. 6, in some embodiments, in addition to last three shift register units, a first reset control signal terminal Re1 of the ($n_2$)-th stage shift register unit (e.g., the first stage shift register unit A1) is connected to a shift signal output terminal CR of the ($n_2$+3)-th stage shift register unit (e.g., the fourth stage shift register unit A4). For example, in a case where the gate driving circuit 20 includes only four shift register units, a first reset control signal terminal Re1 of the second stage shift register unit A2, a first reset control signal terminal Re1 of the third stage shift register unit A3, and a first reset control signal terminal Re1 of the fourth stage shift register unit A4 may be connected to separately provided reset signal lines, respectively.

For example, the gate driving circuit 20 may further include a timing controller T-CON, the timing controller T-CON is configured to provide the above-mentioned respective clock signals to the respective shift register units, for example, and the timing controller T-CON may also be configured to provide a trigger signal and a reset signal. It should be noted that a phase relationship among the plurality of clock signals provided by the timing controller T-CON can be determined according to actual requirements. In different examples, more clock signals can be provided according to different configurations. For example, the gate driving circuit 20 further includes a plurality of voltage lines to provide a plurality of voltage signals to the respective shift register units.

For example, in a case where the gate driving circuit 20 is used to drive a display panel, the gate driving circuit 20 may be disposed on one side of the display panel. Of course, the gate driving circuits 20 may also be disposed on both sides of the display panel to achieve double-sided driving. The embodiments of the present disclosure do not limit the arrangement manner of the gate driving circuits 20. For example, the gate driving circuit 20 may be disposed on one side of the display panel for driving odd-numbered gate lines, while the gate driving circuit 20 may be provided on the other side of the display panel for driving even-numbered gate lines.

Figure 7:
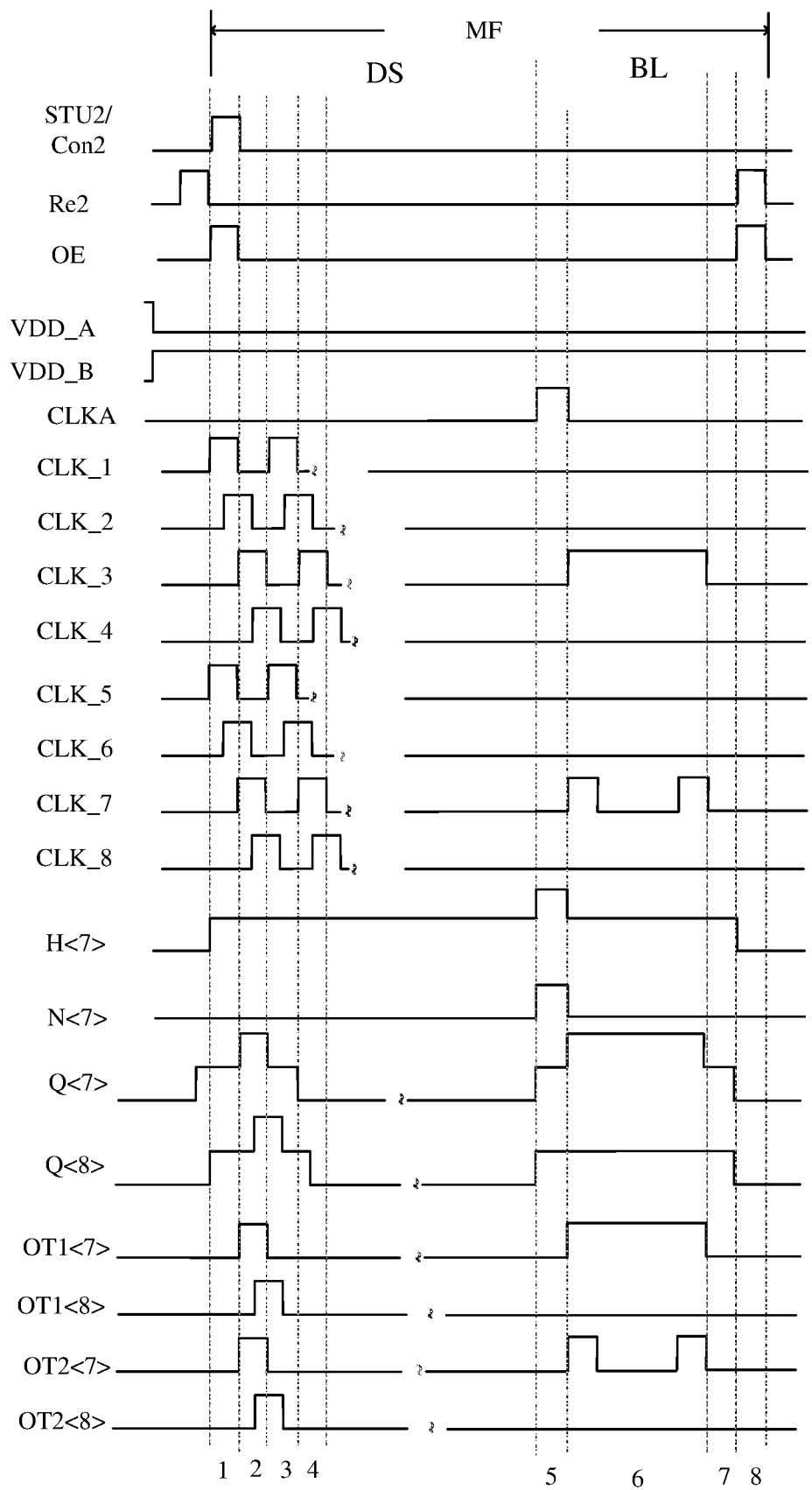
FIG. 7 is a signal timing diagram of a gate driving circuit provided by some embodiments of the present disclosure.

FIG. 7 is a signal timing diagram of a gate driving circuit provided by some embodiments of the present disclosure. The signal timing diagram is the timing diagram of the gate driving circuit 20 as shown in FIG. 6, and the shift register unit in the gate driving circuit 20 is the shift register unit 10 as shown in FIG. 4B. For the operating principle of the gate driving circuit 20, reference can be made to the corresponding description of the shift register unit 10 in the embodiments of the present disclosure, and repeated portions are not described here again.

It should be noted that in FIG. 7, Q<7> and Q<8> respectively represent a first node Q of a seventh stage shift register unit and a first node Q of an eighth stage shift register unit in the gate driving circuit 20. H<7> represents a second node H in the seventh stage shift register unit in the gate driving circuit 20; and N<7> represents a third node N in the seventh stage shift register unit in the gate driving circuit 20. OT1<7> and OT2<7> respectively represent a first scanning signal output terminal OT1 and a second scanning signal output terminal OT2 of the seventh stage shift register unit in the gate driving circuit 20, and OT1<8> and OT2<8> respectively represent a first scanning signal output terminal OT1 and a second scanning signal output terminal OT2 of the eighth stage shift register unit in the gate driving circuit 20. MF represents a (M)-th frame, M is a positive integer. DS represents a display period in one frame, BL represents a blanking period in one frame. It should be noted that because the potential of the first scanning signal output terminal OT1 and the potential of the shift signal output terminal CR in each stage shift register unit are the same, the shift signal output terminal CR is not shown in FIG. 7. It is worth noting that the signal levels in the signal timing diagrams as shown in FIGS. 5 and 7 are only schematic and do not represent real level values.

For example, in the display period DS, the shift register unit 10 outputs scan drive signals row by row to the plurality of gate lines until a scan drive signal is output to a last gate line of the plurality of gate lines, thereby completing the display of one frame. For example, in the (M)-th frame, pixel units in an (n)-th row need to be detected and compensated, and the pixel units in the (n)-th row are connected to the output terminal of an (n)-th stage shift register unit 10, so that in the blanking period BL, a first scanning signal output terminal OT1 of the (n)-th stage shift register unit 10 outputs a high-level signal to detect the pixel units in the (n)-th row.

For example, as shown in FIGS. 4B and 7, if it is necessary to detect pixel units in a seventh row in the (M)-th frame, the pixel units in the seventh row correspond to the seventh stage shift register unit. In the (M)-th frame, the external control circuit outputs the signal output from the shift signal output terminal CR of a fifth stage shift register unit to the detection control signal terminals OE of the respective shift register units, that is, a waveform pulse width of the detection control signal is the same as a waveform pulse width of the signal output from the shift signal output terminal CR of the fifth stage shift register unit.

Because in the example as shown in FIG. 6, the second input signal terminal BP of the ($n_2$+2)-th stage shift register unit is connected to the shift signal output terminal CR of the ($n_2$)-th stage shift register unit. Thus, in the first phase 1 of the display period DS, in a case where the shift signal output terminal CR of the fifth stage shift register unit outputs a high-level signal, as shown in FIG. 4B, the first transistor M1 in the charging sub-circuit 210 of the seventh stage shift register unit is turned on, and therefore, the high-level signal output from the shift signal output terminal CR of the fifth stage shift register unit is written into the second node H of the seventh stage shift register unit to pull up the second node H of the seventh stage shift register unit to a high level.

For example, as shown in FIG. 7, waveforms of the first clock signal CLK_1, the second clock signal CLK_2, the third clock signal CLK_3, and the fourth clock signal CLK_4 in the display period of one frame are sequentially overlapped by 50% of an effective pulse width, and waveforms of the output signals OT1<1>, OT1<2>, OT1<3>, and OT1<4> of the first scanning signal output terminals OT1 of the first stage to fourth stage shift register units A1-A4 in the display period of one frame are sequentially overlapped by 50% of the effective pulse width. Waveforms of the fifth clock signal line CLK_5, the sixth clock signal line CLK_6, the seventh clock signal line CLK_7, and the eighth clock signal line CLK_8 in the display period of one frame are also sequentially overlapped by 50% of the effective pulse width, and waveforms of the output signals OT2<1>, OT2<2>, OT2<3>, and OT2<4> of the second scanning signal output terminals OT2 of the first stage to fourth stage shift register units A1-A4 are also sequentially overlapped by 50% of the effective pulse width. The waveforms of the output signals of the gate driving circuit 20 are overlapped in the display period, so that the pre-charging function can be achieved, the charging efficiency can be improved, the overall charging duration of the pixel circuit (i.e., the duration of the display period in one frame) can be shortened, and the high refresh rate can be achieved. In this case, pixels located in odd rows and pixels located in even rows on the display panel can be respectively connected to different data lines, so that when pixel units in adjacent two rows are simultaneously charged, the pixel units in the adjacent two rows can respectively receive corresponding data signals.

Figure 9:
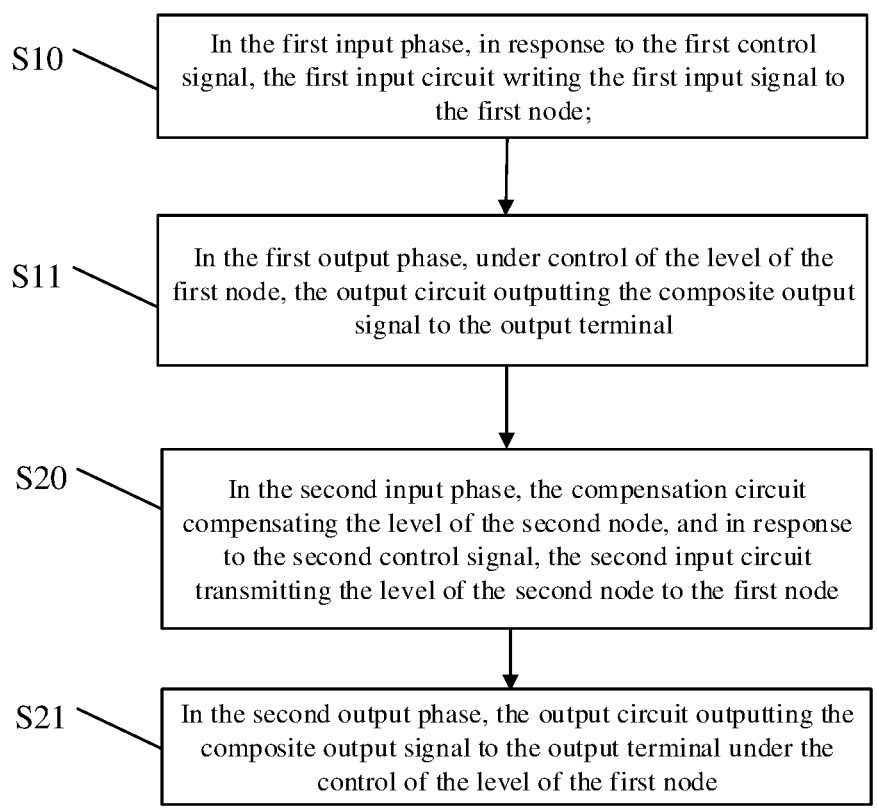
FIG. 9 is a flowchart of a driving method for driving a shift register unit provided by some embodiments of the present disclosure.

It should be noted that in various embodiments of the present disclosure, the gate driving circuit 20 is not limited to a cascade mode described in FIG. 9, but may be any suitable cascade mode. In a case where the cascade mode or the clock signal changes, the overlapping portions of the waveforms of the output signals OT1<1>, OT1<2>, OT1<3>, and OT1<4> of the first scanning signal output terminals OT1 of the first stage to fourth stage shift register units A1-A4 in the display period also change correspondingly. The overlapping portions of the waveforms of the output signals OT2<1>, OT2<2>, OT2<3>, and OT2<4> of the second scanning signal output terminals OT2 of the first stage to fourth stage shift register units A1-A4 in the display period will also change correspondingly, for example, overlapping 33% or 0% (i.e., non-overlapping), so as to meet various application requirements.

For example, as shown in FIG. 7, because the waveform of the signal output from the first scanning signal output terminal OT1 of the seventh stage shift register unit overlaps with the waveform of the signal output from the first scanning signal output terminal OT1 of the eighth stage shift register unit, in the first phase 1, the first transistor M1 in the charging sub-circuit 210 of the eighth stage shift register unit is also turned on during charging the second node H of the seventh stage shift register unit. In a case where the shift signal output terminal CR of the sixth stage shift register unit outputs a high-level signal, the high-level signal outputted from the shift signal output terminal CR of the sixth stage shift register unit is written to the second node H of the eighth stage shift register unit to pull up the second node H of the eighth stage shift register unit to a high level. In a case where the detection control signal OE is at a low level, the potential of the second node H of the seventh stage shift register unit and the potential of the second node H of the eighth stage shift register unit can be maintained until the blanking period BL.

For example, as shown in FIGS. 4B and 7, in a fifth phase of the blanking period BL, the first clock signal CLKA is a high-level signal. Because both the second node H of the seventh stage shift register unit and the second node H of the eighth stage shift register unit are at a high level, the first compensation transistor M15 in the seventh stage shift register unit and the first compensation transistor M15 in the eighth stage shift register unit are turned on, so that the level of the second node H of the seventh stage shift register unit and the level of the second node H of the eighth stage shift register unit can be compensated.

For example, in the fifth phase of the blanking period BL, the first clock signal CLKA is a high-level signal, so that second transistors M2 of shift register units of all stages are turned on. Because both the second node H of the seventh stage shift register unit and the second node H of the eighth stage shift register unit are at a high level (at this time, the level of the second nodes H have been compensated), the first node Q of the seventh stage shift register unit and the first node Q of the eighth stage shift register unit are charged to a high level.

For example, in a sixth phase of the blanking period BL, the third clock signal terminal CLK_3 (for providing the first output clock signal CLKD) connected to the seventh stage shift register unit provides a high-level signal, and the seventh clock signal line CLK_7 (for providing the second output clock signal CLKE) connected to the seventh stage shift register unit provides a pulse signal, and therefore, the first scanning signal output terminal OT1 of the seventh stage shift register unit outputs a high-level signal, and the second scanning signal output terminal OT2 of the seventh stage shift register unit outputs a pulse signal. Thus, in the period of the (M)-th frame, the detection of the pixel units in the seventh row can be achieved.

While the fourth clock signal line CLK_4 (for providing the first output clock signal CLKD) connected to the eighth stage shift register unit provides a low-level signal, and the eighth clock signal line CLK_8 (for providing the second output clock signal CLKE) connected to the eighth stage shift register unit also provides a low-level signal, and therefore, both the first scanning signal output terminal OT1 and the second scanning signal output terminal OT2 of the eighth stage shift register unit output a low-level signal. As a result, in the period of the (M)-th frame, pixel units (which correspond to the eighth stage shift register unit) in an eighth row will not be detected.

It should be noted that in a case of performing random detection compensation, if a pixel unit in a (W)-th row needs to be detected and the pixel unit in the (W)-th row corresponds to a (W)-th stage shift register unit, the detection control signal of each stage shift register unit can change according to the second input signal input to the (W)-th stage shift register unit, so as to ensure that the second input signal transmitted to the (W)-th stage shift register unit is a high-level signal when the first transistor M1 of the (W)-th stage shift register unit is turned on. W is a positive integer.

For example, the relevant descriptions of other phases in the display period DS and the blanking period BL can refer to the detailed descriptions of other phases in the display period DS and the blanking period BL in the shift register unit described above, and repetition portions are not described again herein.

Figure 8:
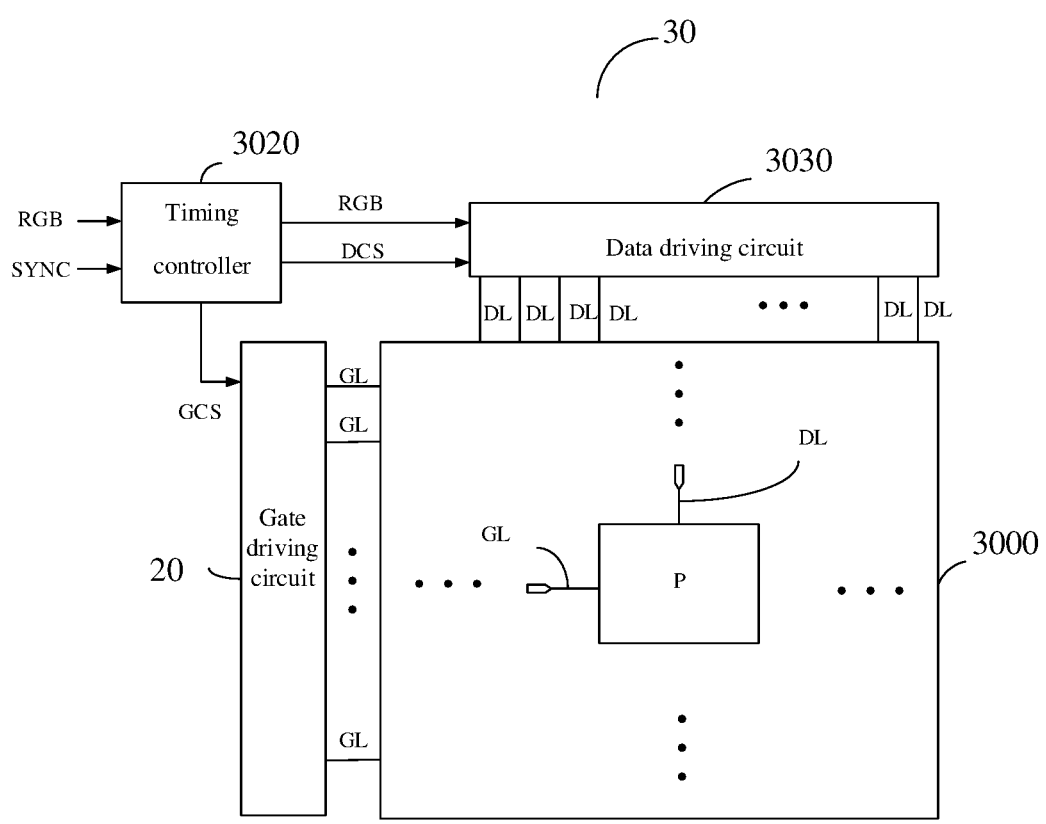
FIG. 8 is a schematic block diagram of a display device provided by some embodiments of the present disclosure.

FIG. 8 is a schematic block diagram of a display device provided by some embodiments of the present disclosure. For example, as shown in FIG. 8, the display device 30 includes a gate driving circuit 20, the gate driving circuit 20 is the gate driving circuit according to any one of embodiments of the present disclosure.

For example, the display device 30 may be any product or component having a display function, such as a liquid crystal panel, a liquid crystal television, a display, an OLED panel, an OLED television, an electronic paper display device, a mobile phone, a tablet computer, a notebook computer, a digital photo frame, a navigator, etc. The embodiments of the present disclosure are not limited thereto. For the technical effects of the display device 30, reference can be made the corresponding descriptions of the shift register unit 10 and the gate driving circuit 20 in the above embodiments, and details are not described again here.

For example, in an example, the display device 30 includes a display panel 3000, a gate driving circuit 20, a timing controller 3020, and a data driving circuit 3030. The display panel 3000 includes a plurality of pixel units P defined by a plurality of gate lines GL and a plurality of data lines DL crossing each other. The gate driving circuit 20 is used for driving the plurality of gate lines GL; the data driving circuit 3030 is used for driving the plurality of data lines DL; the timing controller 3020 is used for processing image data RGB input from outside of the display device 30, and then provides the processed image data RGB to the data driving circuit 3030. The timing controller 3020 is also used for outputting a scanning control signal GCS and a data control signal DCS to the gate driving circuit 20 and the data driving circuit 3030, respectively, for controlling the gate driving circuit 20 and the data driving circuit 3030.

For example, the first scanning signal output terminals OT1 of the plurality of shift register units 10 in the gate driving circuit 20 are correspondingly connected to the plurality of gate lines GL. The first scanning signal output terminals OT1 of the respective shift register units 10 in the gate driving circuit 20 sequentially outputs scan drive signals to the plurality of gate lines GL, so that the plurality of rows of pixel units P in the display panel 3000 achieve progressive scanning during the display period, and the first scanning signal output terminal OT1 of one shift register unit randomly selected from the plurality of shift register units 10 outputs a scan drive signal to the corresponding gate line GL during the blanking period to achieve random compensation detection.

For example, the gate driving circuit 20 may be implemented as a semiconductor chip or may be integrated in the display panel 3000 to constitute a GOA circuit.

For example, the data driving circuit 3030 provides converted data signals to the plurality of data lines DL. For example, the data driving circuit 3030 may be implemented as a semiconductor chip.

For example, the timing controller 3020 processes the image data RGB input from the outside to match a size and resolution of the display panel 3000, and then supplies the processed image data to the data driving circuit 3030. The timing controller 3020 generates a plurality of scanning control signals GCS and a plurality of data control signals DCS using synchronization signals (e.g., a dot clock DCLK, a data enable signal DE, a horizontal synchronization signal Hsync, and a vertical synchronization signal Vsync) input from outside the display device 30.

It should be noted that the display device 30 may also include other components, such as a signal decoding circuit, a voltage conversion circuit, etc. These components may, for example, adopt existing conventional components, and details are not described again here.

At least one embodiment of the present disclosure also provides a driving method for driving a shift register unit, and the driving method can be used to drive the shift register unit provided by any one of embodiments of the present disclosure.

FIG. 9 is a flowchart of a driving method for driving a shift register unit according to some embodiments of the present disclosure. The driving method may include a display period and a blanking period for one frame. The display period includes a first input phase and a first output phase, the blanking period includes a second input phase and a second output phase.

For example, as shown in FIG. 9, the driving method may include the following operations:

S10: In the first input phase, in response to the first control signal, the first input circuit writing the first input signal to the first node;

S11: In the first output phase, under control of the level of the first node, the output circuit outputting the composite output signal to the output terminal;

S20: In the second input phase, the compensation circuit compensating the level of the second node, and in response to the second control signal, the second input circuit transmitting the level of the second node to the first node;

S21: In the second output phase, the output circuit outputting the composite output signal to the output terminal under the control of the level of the first node.

For example, in an example, in the case where the shift register unit 10 includes the third control circuit, step S10 further includes: in response to the fourth control signal, controlling the level of the fourth node, through the third control circuit, to pull down the level of the fourth node to a non-operation potential.

For example, in some examples, the output terminal includes a shift signal output terminal and a first scanning signal output terminal, and the output circuit includes a first output transistor and a second output transistor. Step S11 may include: under the control of the level of the first node, transmitting a display shift signal to the shift signal output terminal via the first output transistor and transmitting a display output signal to the first scanning signal output terminal via the second output transistor. The composite output signal comprises the display output signal and the display shift signal, the display output signal and the display shift signal are the same and both are the first output clock signal. For example, the display output signal may be used to drive pixel units in the display panel for display.

For example, in some examples, step S20 may include: under the control of the level of the second node, writing a high-level first clock signal to a third node; compensating the level of the second node based on the high-level first clock signal written to the third node; then, in response to the second control signal, transmitting the level of the compensated second node to the first node.

For example, in another example, in the case where the shift register unit 10 includes the second control circuit, step S20 further includes: in response to the third control signal, controlling the level of the fourth node to pull down the level of the fourth node to a non-operation potential.

For example, in some examples, step S21 may include: under the control of the level of the first node, transmitting a blanking shift signal to the shift signal output terminal via the first output transistor and transmitting a blanking output signal to the first scanning signal output terminal via the second output transistor. The composite output signal comprises the blanking output signal and the blanking shift signal, the blanking output signal and the blanking shift signal are the same and both are the first output clock signal. For example, the blanking output signal may be used to drive pixel units in the display panel for performing external compensation.

It should be noted that in the embodiment of the shift register unit described above, the first output signal may include the display shift signal and the blanking shift signal, and the second output signal may include the display output signal and the blanking output signal. The display output signal may be a signal output by the first scanning signal output terminal during the display period, the display shift signal may be a signal output by the shift signal output terminal during the display period, the display shift signal and the display output signal may be the same, and the display output signal may be, for example, a pulse signal; and the blanking output signal may be a signal output by the first scanning signal output terminal during the blanking period, the blanking shift signal may be a signal output by the shift signal output terminal during the blanking period, the blanking shift signal and the blanking output signal may be the same, and the blanking output signal may be, for example, a high-level signal.

For example, in the display period, after step S11, the driving method may further include: in a display reset phase, under the control of the first reset signal, resetting the first node; under the control of the level of the fourth node, performing noise reduction on the first node, the shift signal output terminal, the first scanning signal output terminal, and the second scanning signal output terminal through a noise reduction circuit.

For example, in the blanking period, after step S21, the driving method may further include: in a blanking reset phase, under the control of the second reset signal and the detection control signal, resetting the first node and the second node.

It should be noted that the detailed description and technical effects of the driving method can refer to the corresponding descriptions of the shift register unit 10 and the gate driving circuit 20 in the embodiments of the present disclosure, and are not repeated herein.

For the present disclosure, the following points need to be explained:

(1) The accompanying drawings of the embodiments of the present disclosure only involve structures related to the embodiments of the present disclosure, and other structures can refer to usual designs.

(2) For the sake of clarity, in accompanying drawings for illustrating the embodiment(s) of the present disclosure, the thickness and size of a layer or a structure may be enlarged. It will be understood that in a case where an element such as a layer, film, region, or substrate is referred to as being "on" or "under" another element, the element may be "directly" "on" or "under" the other element, or a component or element is interposed therebetween.

(3) In case of no conflict, the embodiments of the present disclosure and the features in the embodiments of the present disclosure can be combined with each other to obtain new embodiments.

What have been described above merely are exemplary embodiments of the present disclosure, the protection scope of the present disclosure is not limited thereto, and the protection scope of the present disclosure should be based on the protection scope of the claims.

What is claimed is:

1. A shift register unit, comprising: a first input circuit, a second input circuit, an output circuit, and a compensation circuit,
   wherein the first input circuit is connected to a first node, and is configured to write a first input signal to the first node in response to a first control signal;
   the second input circuit is connected to the first node and a second node, and is configured to input a second input signal to the second node in response to a detection control signal and configured to transmit a level of the second node to the first node in response to a second control signal;
   the compensation circuit is connected to the second node, and is configured to compensate the level of the second node; and
   the output circuit is connected to the first node and an output terminal, and is configured to output a composite output signal to the output terminal under control of a level of the first node;
   the compensation circuit comprises a first compensation sub-circuit, a second compensation sub-circuit, and a storage sub-circuit,
   the first compensation sub-circuit is connected to the second node and a third node, respectively, and is configured to write a first clock signal to the third node under control of the level of the second node;
   the storage sub-circuit is connected to the second node and the third node, respectively, and is configured to compensate the level of the second node based on the first clock signal written to the third node; and
   the second compensation sub-circuit is connected to the third node, and is configured to perform noise reduction on the third node under control of a compensation noise reduction signal.

2. The shift register unit according to claim 1, wherein the second compensation sub-circuit is further connected to a fourth node to receive a voltage of the fourth node as the compensation noise reduction signal.

3. The shift register unit according to claim 2, wherein the first compensation sub-circuit comprises a first compensation transistor, the second compensation sub-circuit comprises a second compensation transistor, the storage sub-circuit comprises a first capacitor,
   a first electrode of the first compensation transistor is connected to a first clock signal terminal to receive the first clock signal, a second electrode of the first compensation transistor is connected to the third node, a gate electrode of the first compensation transistor is connected to the second node,
   a first terminal of the first capacitor is connected to the second node, a second terminal of the first capacitor is connected to the third node,
   a first electrode of the second compensation transistor is connected to the third node, a second electrode of the second compensation transistor is connected to a first voltage terminal, and a gate electrode of the second compensation transistor is connected to the fourth node.

4. The shift register unit according to claim 1, wherein the second input circuit comprises a charging sub-circuit and an isolation sub-circuit,
   the charging sub-circuit is configured to input the second input signal to the second node in response to the detection control signal; and
   the isolation sub-circuit is connected to the first node and the second node, respectively, and is configured to transmit the level of the second node to the first node under control of the second control signal.

5. The shift register unit according to claim 4, wherein the charging sub-circuit comprises a first transistor, a gate electrode of the first transistor is configured to receive the detection control signal, a first electrode of the first transistor is configured to receive the second input signal, and a second electrode of the first transistor is connected to the second node; and
   the isolation sub-circuit comprises a second transistor, a gate electrode of the second transistor is configured to receive the second control signal, a first electrode of the second transistor is connected to the second node, and a second electrode of the second transistor is connected to the first node.

6. The shift register unit according to claim 1, wherein the output terminal comprises a shift signal output terminal and a first scanning signal output terminal,
the output circuit comprises a first output transistor, a second output transistor, and a second capacitor;
a gate electrode of the first output transistor is connected to the first node, a first electrode of the first output transistor is connected to a first output clock signal terminal to receive a first output clock signal, and a second electrode of the first output transistor is connected to the shift signal output terminal;
a gate electrode of the second output transistor is connected to the first node, a first electrode of the second output transistor is connected to the first output clock signal terminal to receive the first output clock signal, and a second electrode of the second output transistor is connected to the first scanning signal output terminal;
a first terminal of the second capacitor is connected to the first node, and a second terminal of the second capacitor is connected to the second electrode of the second output transistor; and
the first output clock signal is transmitted to the shift signal output terminal via the first output transistor and serves as a first output signal, the first output clock signal is transmitted to the first scanning signal output terminal via the second output transistor and serves as a second output signal, and the composite output signal comprises the first output signal and the second output signal.

7. The shift register unit according to claim 6, wherein the output terminal further comprises a second scanning signal output terminal, and the output circuit further comprises a third output transistor and a third capacitor,
a gate electrode of the third output transistor is connected to the first node, a first electrode of the third output transistor is connected to a second output clock signal terminal to receive a second output clock signal, a second electrode of the third output transistor is connected to the second scanning signal output terminal,
a first terminal of the third capacitor is connected to the first node, a second terminal of the third capacitor is connected to the second electrode of the third output transistor, and
the second output clock signal is transmitted to the second scanning signal output terminal via the third output transistor and serves as a third output signal, and the composite output signal further comprises the third output signal.

8. The shift register unit according to claim 1, further comprising a noise reduction circuit and a first control circuit,
wherein the noise reduction circuit is connected to the first node, a fourth node, and the output terminal, and is configured to simultaneously perform noise reduction on the first node and the output terminal under control of a level of the fourth node; and
the first control circuit is connected to the first node and the fourth node, and is configured to control the level of the fourth node under control of the level of the first node.

9. The shift register unit according to claim 1, further comprising: a second control circuit,
wherein the second control circuit is connected to a fourth node, and is configured to control a level of the fourth node in response to a third control signal, and the third control signal comprises a first clock signal and a voltage of the second node.

10. The shift register unit according to claim 1, further comprising a first reset circuit and a second reset circuit,
wherein the first reset circuit is connected to the first node, and is configured to reset the first node in response to a first reset control signal; and
the second reset circuit is connected to the first node, and is configured to reset the first node in response to a second reset control signal.

11. The shift register unit according to claim 1, further comprising a noise reduction circuit, a first control circuit, a second control circuit, a third control circuit, a first reset circuit, and a second reset circuit,
wherein the first compensation sub-circuit comprises a first compensation transistor, the second compensation sub-circuit comprises a second compensation transistor, the storage sub-circuit comprises a first capacitor, a first electrode of the first compensation transistor is connected to a first clock signal terminal to receive a first clock signal, a second electrode of the first compensation transistor is connected to a third node, a gate electrode of the first compensation transistor is connected to the second node, a first terminal of the first capacitor is connected to the second node, a second terminal of the first capacitor is connected to the third node, a first electrode of the second compensation transistor is connected to the third node, a second electrode of the second compensation transistor is connected to a first voltage terminal, and a gate electrode of the second compensation transistor is connected to a fourth node to receive a voltage of the fourth node as a compensation noise reduction signal;
the second input circuit comprises a charging sub-circuit and an isolation sub-circuit,
the charging sub-circuit comprises a first transistor, a gate electrode of the first transistor is configured to receive the detection control signal, a first electrode of the first transistor is configured to receive the second input signal, a second electrode of the first transistor is connected to the second node,
the isolation sub-circuit comprises a second transistor, a gate electrode of the second transistor is configured to receive the second control signal, a first electrode of the second transistor is connected to the second node, and a second electrode of the second transistor is connected to the first node;
the first input circuit comprises a third transistor, a gate electrode of the third transistor is configured to receive the first control signal, a first electrode of the third transistor is configured to receive the first input signal, and a second electrode of the third transistor is connected to the first node;
the output circuit comprises a first output transistor, a second output transistor, a third output transistor, a second capacitor, and a third capacitor, and the output terminal comprises a shift signal output terminal, a first scanning signal output terminal, and a second scanning signal output terminal,
a gate electrode of the first output transistor is connected to the first node, a first electrode of the first output transistor is connected to a first output clock signal terminal to receive a first output clock signal, a second electrode of the first output transistor is connected to the shift signal output terminal,
a gate electrode of the second output transistor is connected to the first node, a first electrode of the second output transistor is connected to the first output clock signal terminal to receive the first output clock signal, a second electrode of the second output transistor is connected to the first scanning signal output terminal, a first terminal of the second capacitor is connected to the first node, a second terminal of the second capacitor is connected to the second electrode of the first output transistor, a gate electrode of the third output transistor is connected to the first node, a first electrode of the third output transistor is connected to a second output clock signal terminal to receive a second output clock signal, a second electrode of the third output transistor is connected to the second scanning signal output terminal, a first terminal of the third capacitor is connected to the first node, a second terminal of the third capacitor is connected to the second electrode of the third output transistor, the first output clock signal is transmitted to the shift signal output terminal via the first output transistor and serves as a first output signal, the first output clock signal is transmitted to the first scanning signal output terminal via the second output transistor and serves as a second output signal, the second output clock signal is transmitted to the second scanning signal output terminal via the third output transistor and serves as a third output signal, and the composite output signal comprises the first output signal, the second output signal, and the third output signal;

the noise reduction circuit comprises a fourth transistor, a fifth transistor, a sixth transistor, and a seventh transistor, a gate electrode of the fourth transistor is connected to the fourth node, a first electrode of the fourth transistor is connected to the first node, a second electrode of the fourth transistor is connected to the first voltage terminal, a gate electrode of the fifth transistor is connected to the fourth node, a first electrode of the fifth transistor is connected to the shift signal output terminal, a second electrode of the fifth transistor is connected to the first voltage terminal, a gate electrode of the sixth transistor is connected to the fourth node, a first electrode of the sixth transistor is connected to the first scanning signal output terminal, a second electrode of the sixth transistor is connected to a second voltage terminal, a gate electrode of the seventh transistor is connected to the fourth node, a first electrode of the seventh transistor is connected to the second scanning signal output terminal, and a second electrode of the seventh transistor is connected to the second voltage terminal;

the first control circuit comprises an eighth transistor and a ninth transistor, a gate electrode of the eighth transistor is connected to a first electrode of the eighth transistor, and is configured to be connected to a third voltage terminal, a second electrode of the eighth transistor is connected to the fourth node, a gate electrode of the ninth transistor is connected to the first node, a first electrode of the ninth transistor is connected to the fourth node, and a second electrode of the ninth transistor is connected to the first voltage terminal;

the first reset circuit comprises a tenth transistor, a gate electrode of the tenth transistor is connected to a first reset control signal terminal to receive a first reset control signal, a first electrode of the tenth transistor is connected to the first node, and a second electrode of the tenth transistor is connected to the first voltage terminal;

the second reset circuit comprises an eleventh transistor, a gate electrode of the eleventh transistor is connected to a second reset control signal terminal to receive a second reset control signal, a first electrode of the eleventh transistor is connected to the first node, and a second electrode of the eleventh transistor is connected to the first voltage terminal;

the second control circuit comprises a twelfth transistor and a thirteenth transistor, a gate electrode of the twelfth transistor is configured to receive the first clock signal, a first electrode of the twelfth transistor is configured to be connected to the fourth node, a second electrode of the twelfth transistor is connected to a first electrode of the thirteenth transistor, a gate electrode of the thirteenth transistor is connected to the second node, and a second electrode of the thirteenth transistor is connected to the first voltage terminal; and the third control circuit comprises a fourteenth transistor, a gate electrode of the fourteenth transistor is configured to receive a fourth control signal, a first electrode of the fourteenth transistor is connected to the fourth node, and a second electrode of the fourteenth transistor is connected to the first voltage terminal.

12. A gate driving circuit, comprising a plurality of shift register units, wherein the plurality of shift register units are cascaded, and each shift register unit in the plurality of shift register units comprises: a first input circuit, a second input circuit, an output circuit, and a compensation circuit, the first input circuit is connected to a first node, and is configured to write a first input signal to the first node in response to a first control signal;

the second input circuit is connected to the first node and a second node, and is configured to input a second input signal to the second node in response to a detection control signal and configured to transmit a level of the second node to the first node in response to a second control signal;

the compensation circuit is connected to the second node, and is configured to compensate the level of the second node; and the output circuit is connected to the first node and an output terminal, and is configured to output a composite output signal to the output terminal under control of a level of the first node;

the compensation circuit comprises a first compensation sub-circuit, a second compensation sub-circuit, and a storage sub-circuit, the first compensation sub-circuit is connected to the second node and a third node, respectively, and is configured to write a first clock signal to the third node under control of the level of the second node;

the storage sub-circuit is connected to the second node and the third node, respectively, and is configured to compensate the level of the second node based on the first clock signal written to the third node; and the second compensation sub-circuit is connected to the third node, and is configured to perform noise reduction on the third node under control of a compensation noise reduction signal.

13. The gate driving circuit according to claim 12, further comprising a first clock signal line, a second clock signal line, a third clock signal line, and a fourth clock signal line, wherein in a case where the shift register unit comprises a first output clock signal terminal,
- a first output clock signal terminal of a $(4n_1-3)$-th stage shift register unit in the plurality of shift register units is connected to the first clock signal line;
- a first output clock signal terminal of a $(4n_1-2)$-th stage shift register unit in the plurality of shift register units is connected to the second clock signal line;
- a first output clock signal terminal of a $(4n_1-1)$-th stage shift register unit in the plurality of shift register units is connected to the third clock signal line;
- a first output clock signal terminal of a $(4n_1)$-th stage shift register unit in the plurality of shift register units is connected to the fourth clock signal line; and
- $n_1$ is an integer greater than zero.

14. The gate driving circuit according to claim 13, further comprising a fifth clock signal line, a sixth clock signal line, a seventh clock signal line, and an eighth clock signal line,
wherein in a case where the shift register unit comprises a second output clock signal terminal,
- a second output clock signal terminal of the $(4n_1-3)$-th stage shift register unit is connected to the fifth clock signal line;
- a second output clock signal terminal of the $(4n_1-2)$-th stage shift register unit is connected to the sixth clock signal line;
- a second output clock signal terminal of the $(4n_1-1)$-th stage shift register unit is connected to the seventh clock signal line; and
- a second output clock signal terminal of the $(4n_1)$-th stage shift register unit is connected to the eighth clock signal line.

15. The gate driving circuit according to claim 12, wherein in a case where the shift register unit comprises a shift signal output terminal and a first control signal terminal,
- a first control signal terminal of an $(n_2+3)$-th stage shift register unit in the plurality of shift register units is connected to a shift signal output terminal of an $(n_2)$-th stage shift register unit in the plurality of shift register units, and $n_2$ is an integer greater than zero.

16. The gate driving circuit according to claim 15, wherein a signal output from the shift signal output terminal of the $(n_2)$-th stage shift register unit serves as a second input signal of an $(n_2+2)$-th stage shift register unit.

17. The gate driving circuit according to claim 15, wherein in a case where the shift register unit further comprises a first reset control signal terminal,
- a first reset control signal terminal of the $(n_2)$-th stage shift register unit is connected to a shift signal output terminal of the $(n_2+3)$-th stage shift register unit.

18. A display device, comprising the gate driving circuit according to claim 12.

19. A driving method for driving a shift register unit, wherein one frame comprises a display period and a blanking period, the display period comprises a first input phase and a first output phase, the blanking period comprises a second input phase and a second output phase, the shift register unit comprises: a first input circuit, a second input circuit, an output circuit, and a compensation circuit,
- the first input circuit is connected to a first node, and is configured to write a first input signal to the first node in response to a first control signal;
- the second input circuit is connected to the first node and a second node, and is configured to input a second input signal to the second node in response to a detection control signal and configured to transmit a level of the second node to the first node in response to a second control signal;
- the compensation circuit is connected to the second node, and is configured to compensate the level of the second node;
- the output circuit is connected to the first node and an output terminal, and is configured to output a composite output signal to the output terminal under control of a level of the first node;
- the compensation circuit comprises a first compensation sub-circuit, a second compensation sub-circuit, and a storage sub-circuit,
- the first compensation sub-circuit is connected to the second node and a third node, respectively, and is configured to write a first clock signal to the third node under control of the level of the second node;
- the storage sub-circuit is connected to the second node and the third node, respectively, and is configured to compensate the level of the second node based on the first clock signal written to the third node; and
- the second compensation sub-circuit is connected to the third node, and is configured to perform noise reduction on the third node under control of a compensation noise reduction signal; and the driving method comprises:
- in the first input phase, in response to the first control signal, the first input circuit writing the first input signal to the first node;
- in the first output phase, under control of the level of the first node, the output circuit outputting the composite output signal to the output terminal;
- in the second input phase, the compensation circuit compensating the level of the second node, and in respond to the second control signal, the second input circuit transmitting the level of the second node to the first node; and
- in the second output phase, the output circuit outputting the composite output signal to the output terminal under control of the level of the first node.

* * * * *